(12) United States Patent
Yu et al.

(10) Patent No.: US 12,142,524 B2
(45) Date of Patent: Nov. 12, 2024

(54) VIA FOR COMPONENT ELECTRODE CONNECTION

(71) Applicant: Taiwan Semiconductor Manufacturing Co., Ltd., Hsinchu (TW)

(72) Inventors: Chen-Hua Yu, Hsinchu (TW); Chi-Hsi Wu, Hsinchu (TW); Wen-Chih Chiou, Zhunan Township (TW); Tsang-Jiuh Wu, Hsinchu (TW); Der-Chyang Yeh, Hsinchu (TW); Ming Shih Yeh, Zhubei (TW); An-Jhih Su, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/870,467

(22) Filed: Jul. 21, 2022

(65) Prior Publication Data

US 2022/0359284 A1   Nov. 10, 2022

Related U.S. Application Data

(63) Continuation of application No. 16/213,623, filed on Dec. 7, 2018, now Pat. No. 11,469,138.

(60) Provisional application No. 62/667,305, filed on May 4, 2018.

(51) Int. Cl.
| | |
|---|---|
| *H01L 21/768* | (2006.01) |
| *H01L 23/00* | (2006.01) |
| *H01L 23/522* | (2006.01) |
| *H01L 29/40* | (2006.01) |

(52) U.S. Cl.
CPC .. *H01L 21/76877* (2013.01); *H01L 21/76843* (2013.01); *H01L 21/76871* (2013.01); *H01L 23/5226* (2013.01); *H01L 24/09* (2013.01); *H01L 29/40* (2013.01)

(58) Field of Classification Search
CPC ......... H01L 21/76877; H01L 21/76843; H01L 21/76841; H01L 29/40; H01L 21/76871; H01L 23/5226; H01L 24/09
USPC ....................................................... 257/774
See application file for complete search history.

(56) References Cited

U.S. PATENT DOCUMENTS

| | | | |
|---|---|---|---|
| 2004/0033638 A1 | 2/2004 | Bader et al. | |
| 2005/0098792 A1 | 5/2005 | Lee et al. | |
| 2006/0057836 A1 | 3/2006 | Nagarajan et al. | |
| 2006/0163587 A1* | 7/2006 | Erchak | H01L 25/0753 257/E33.059 |
| 2008/0029761 A1 | 2/2008 | Peng | |
| 2008/0179602 A1* | 7/2008 | Negley | H01L 27/156 438/34 |

(Continued)

FOREIGN PATENT DOCUMENTS

CN    105304598 A    2/2016

*Primary Examiner* — Lex H Malsawma
*Assistant Examiner* — Eric W Jones
(74) *Attorney, Agent, or Firm* — Slater Matsil, LLP

(57) ABSTRACT

Embodiments provide a high aspect ratio via for coupling a top electrode of a vertically oriented component to the substrate, where the top electrode of the component is coupled to the via by a conductive bridge, and where the bottom electrode of the component is coupled to substrate. Some embodiments provide for mounting the component by a component wafer and separating the components while mounted to the substrate. Some embodiments provide for mounting individual components to the substrate.

20 Claims, 31 Drawing Sheets

(56) References Cited

U.S. PATENT DOCUMENTS

| | | |
|---|---|---|
| 2010/0163887 A1 | 7/2010 | Kim et al. |
| 2010/0244201 A1 | 9/2010 | Kitada |
| 2010/0258827 A1 | 10/2010 | Lee et al. |
| 2011/0278620 A1* | 11/2011 | Yoo .................... H01L 33/502 |
| | | 257/E33.068 |
| 2011/0297972 A1* | 12/2011 | Seo ................... H01L 25/0753 |
| | | 257/E33.062 |
| 2012/0181568 A1 | 7/2012 | Hsia et al. |
| 2012/0276736 A1* | 11/2012 | Idani ............... H01L 21/76816 |
| | | 438/642 |
| 2012/0286240 A1 | 11/2012 | Yu et al. |
| 2013/0020589 A1 | 1/2013 | Yu et al. |
| 2014/0110747 A1* | 4/2014 | Iwanaga ................ H01L 33/38 |
| | | 257/99 |
| 2014/0231851 A1* | 8/2014 | Tsai .................... H01L 33/405 |
| | | 257/98 |
| 2015/0144870 A1 | 5/2015 | An |
| 2016/0172545 A1 | 6/2016 | Engl et al. |
| 2018/0013043 A1 | 1/2018 | Perlmaier et al. |

* cited by examiner

VIA FOR COMPONENT ELECTRODE CONNECTION

PRIORITY CLAIM AND CROSS-REFERENCE

This application is a continuation of U.S. application Ser. No. 16/213,623, filed Dec. 7, 2018, now U.S. Pat. No. 11,469,138, issued Oct. 11, 2022, which claims the benefit of U.S. Provisional Application No. 62/667,305, filed on May 4, 2018, and entitled "High Aspect Ratio Via for Component Electrode Connection," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
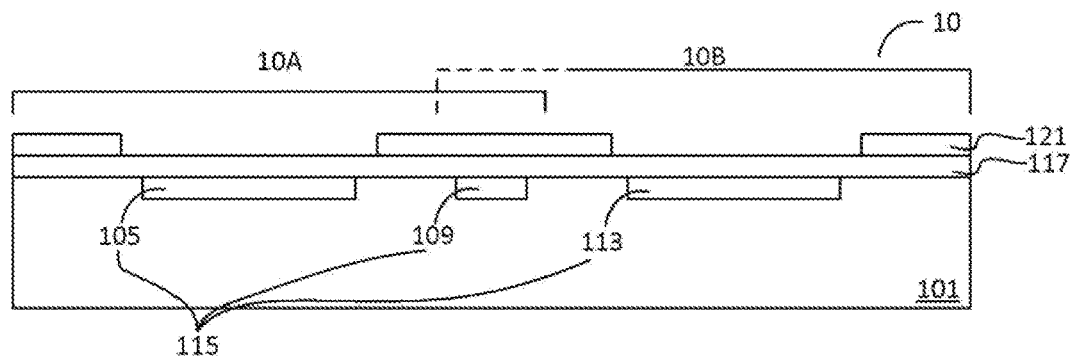
FIGS. 1 through 5 illustrate various views of intermediate processes of forming a high aspect ratio via, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide a high aspect ratio via between components vertically mounted on a substrate. Components which are vertically mounted have a top or upper electrode and a bottom electrode. The bottom electrode may be mounted to a substrate and the top electrode is coupled to the substrate by the high aspect ratio via. The via couples a top electrode of the component to the underlying substrate. Because the via has a high aspect ratio (e.g., between about 2 and about 10 height to width, such as about 5), the via provides the ability to reduce spacing between components. Embodiments may include an integrated passive device (IPD) or surface mount device (SMD) package having passive device dies. However, various embodiments may also be applied to other types of packages, such as packages having active device dies.

FIGS. 1 through 35 illustrate intermediate steps and views of a process of forming a high aspect ratio via in accordance with some embodiments. FIGS. 36 through 46 illustrate intermediate steps and views of a process of forming a high aspect ratio via in accordance with other embodiments. FIGS. 1 through 35 include various top views which are not repeated in FIGS. 36 through 46, but which should be understood as being similarly representative of the embodiments illustrated in FIGS. 36 through 46.

Figure 5:
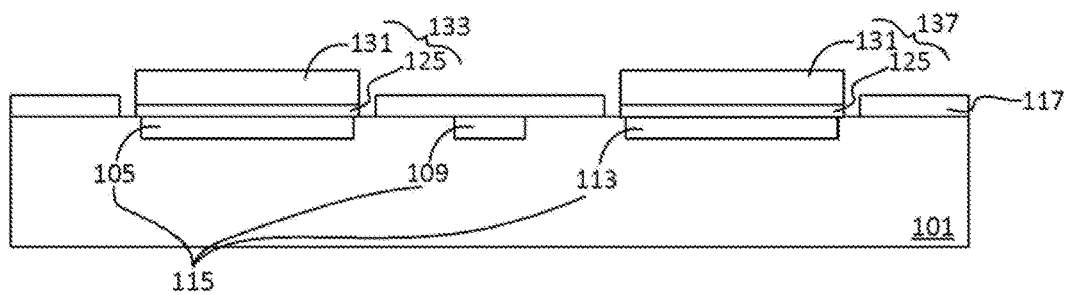
Figure 6:
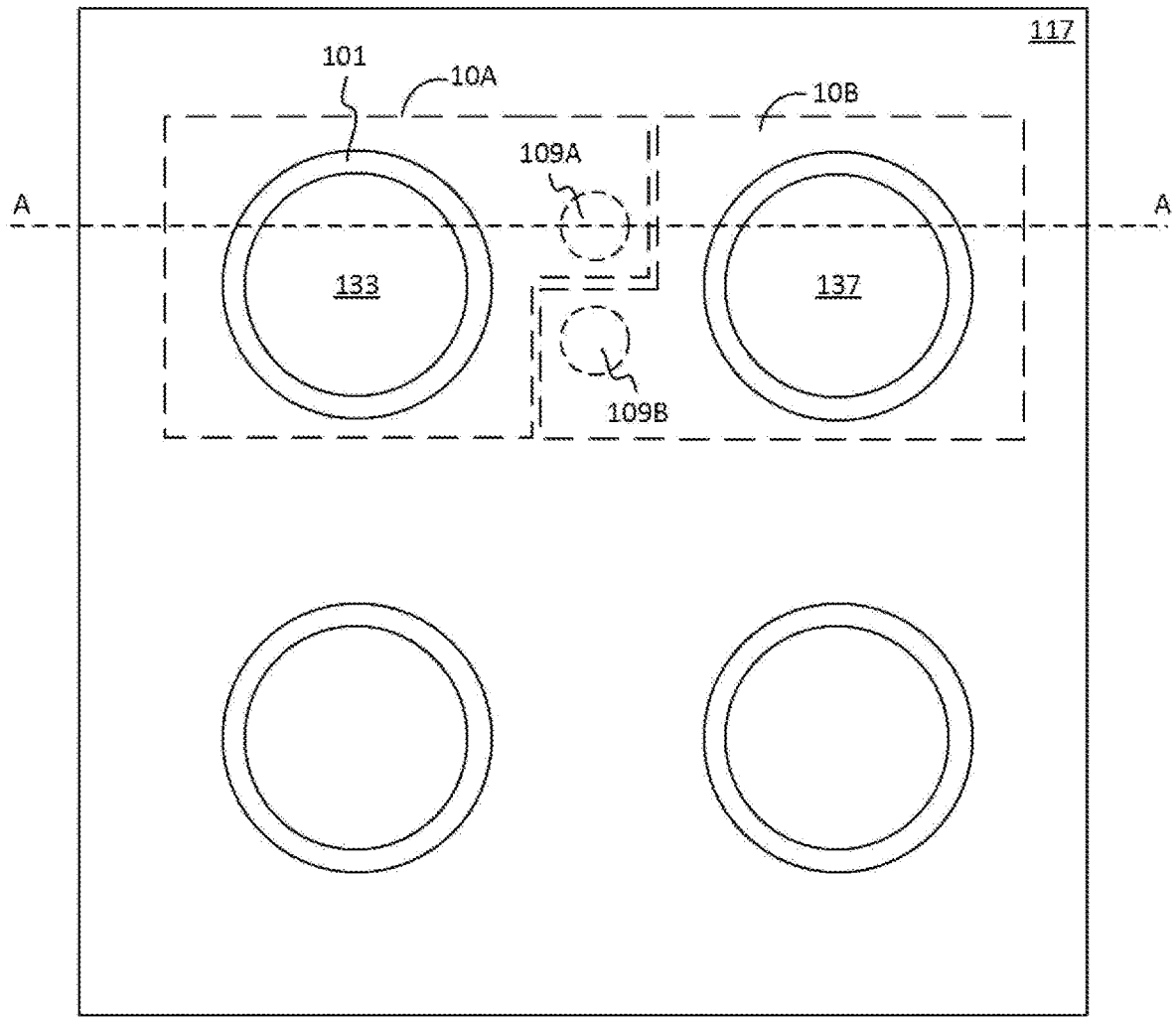
FIGS. 6 through 7 illustrate a component substrate, in accordance with some embodiments.
Figure 7:
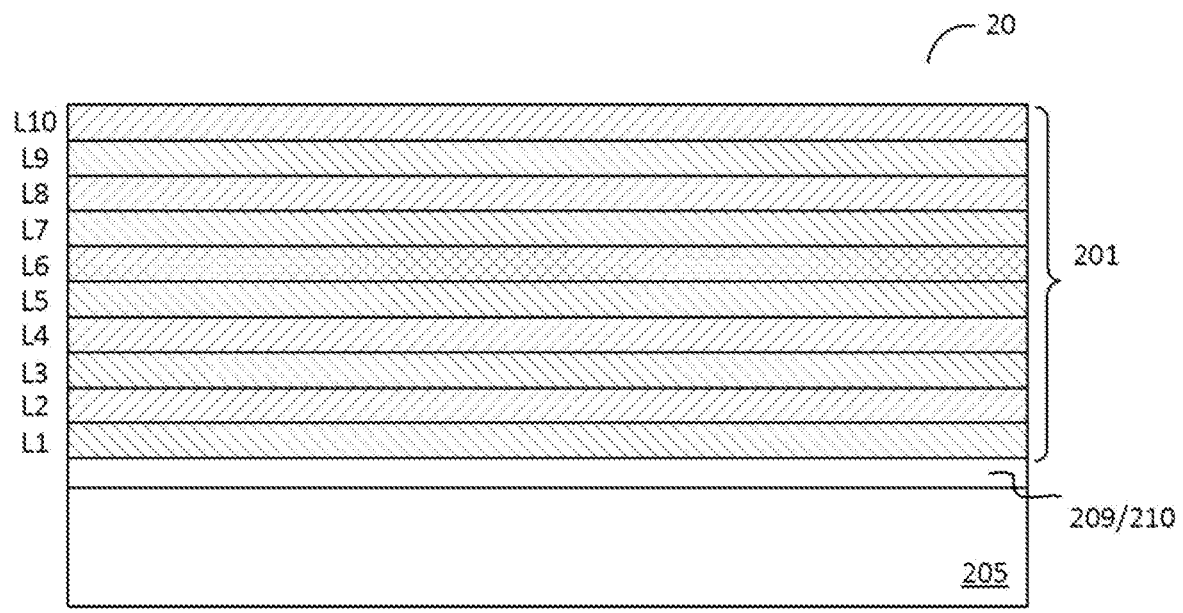
Figure 8:
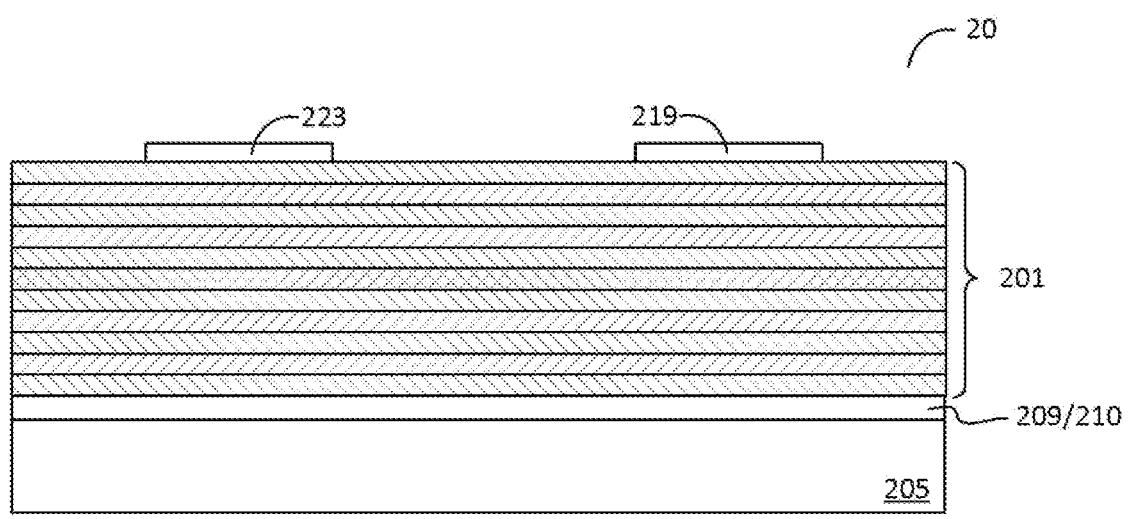
FIGS. 8 through 27, 27a, 28, 28a, and 29 through 35 illustrate various views of intermediate processes of forming a high aspect ratio via, in accordance with some embodiments.
Figure 34:
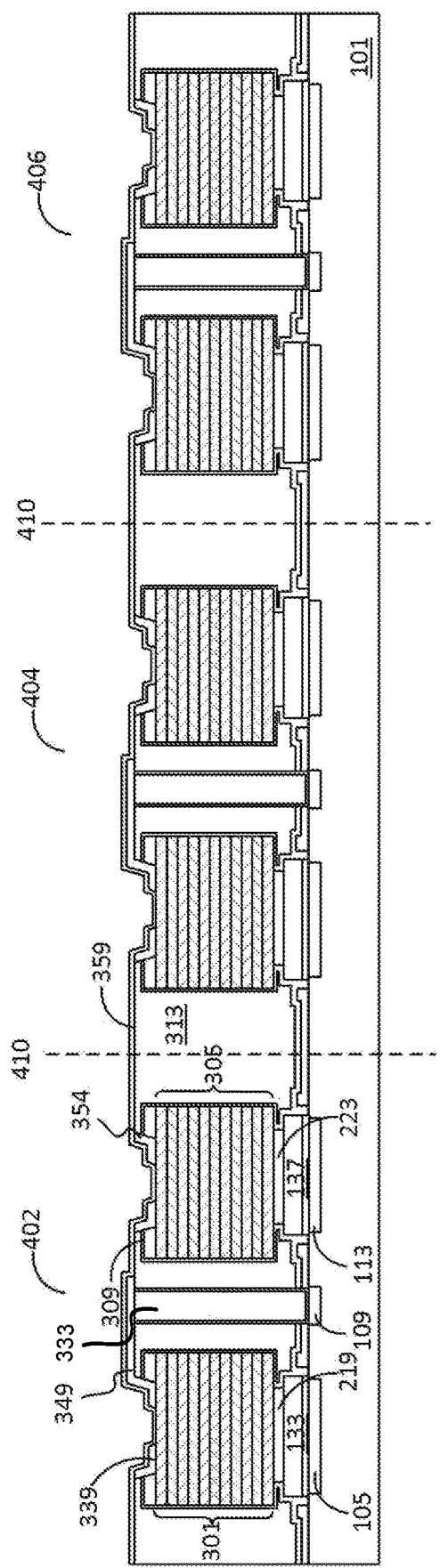
Figure 35:
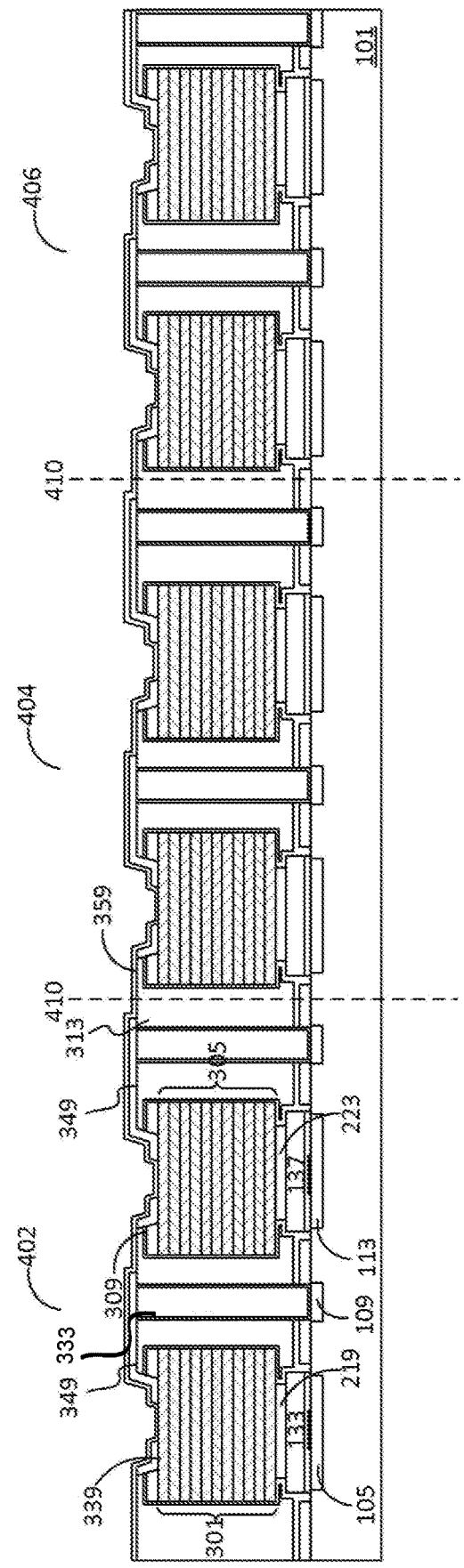

In FIGS. 1 through 7, a substrate is prepared to receive a component substrate mounted to its surface. In FIGS. 7 through 8, the component substrate is prepared to be mounted to the substrate. In FIGS. 9 through 14, a component substrate is mounted to a substrate and components are formed from the component substrate while mounted to the substrate. In FIGS. 15 through 33 a via is formed from a top electrode of the mounted components to contact pads in the substrate. In FIGS. 34 through 35, the substrate is singulated to form a packaged device such as an IPD or SMD, in accordance with some embodiments.

Referring now to FIG. 1, FIG. 1 illustrates a substrate 101 which may or may not have active or passive components (not shown) formed therein. Substrate 101 may be a semiconductor material, such as silicon, silicon germanium, or the like and may have doped regions according to a design of substrate 101. In some embodiments, substrate 101 may be part of a wafer or chip. In some embodiments, substrate 101 may have at least one device formed therein. A top portion of substrate 101 has conductive features 115 formed therein which include metal pad 105, metal pad 109, and metal pad 113. In some embodiments one or more of conductive features 115 may be coupled to a corresponding device in substrate 101. In some embodiments, conductive features 115 may be part of or directly overlying a redistribution structure (not shown) which routes signal, power, and ground lines for substrate 101. It should be understood that substrate 101 may be a partial representation of a larger substrate in which conductive features 115 include additional metal pads.

FIG. 1 illustrates a first component attachment area 10A and a second component attachment area 10B. In the cross-section illustrated in FIG. 1, the second component attachment area 10B appears to overlap the first component attachment area 10A, however, as illustrated by the dashed lines, part of the second component attachment area 10B is in a different plane, than the view presented in FIG. 1 (see FIG. 6). The cross-section of FIG. 1 is merely an example and the various component attachment areas may be defined differently based on a layout. See for example, FIG. 30 which includes other (but not all) layout possibilities. This will be further explained in detail below.

Still referring to FIG. 1, hard mask 117 is formed over substrate 101 and conductive features 115. In some embodiments, hard mask 117 is formed of a dielectric including a polymer, such as polybenzoxazole (PBO), polyimide, benzocyclobutene (BCB), or the like. In other embodiments, hard mask 117 is formed of a nitride such as silicon nitride; an oxide such as silicon oxide, phosphosilicate glass (PSG), borophosphosilicate glass (BPSG), fluorosilicate glass (FSG); or the like. Other materials may be used as well. Hard mask 117 may be formed by any acceptable deposition process, such as spin coating, chemical vapor deposition (CVD), laminating, the like, or a combination thereof.

A photoresist 121 may overlie hard mask 117 and may be patterned using acceptable photolithography techniques. The photoresist 121 may be formed by spin coating or the like and may be exposed to light for patterning. The patterning forms openings through the photoresist 121 which correspond to one or more underlying metal pads of the conductive features 115, such as metal pad 105 and metal pad 113. The openings in the photoresist 121 may be about the same size as the metal pad 105 and/or metal pad 113, larger than the metal pad 105 and/or metal pad 113, or smaller than the metal pad 105 and/or metal pad 113.

Figure 2:
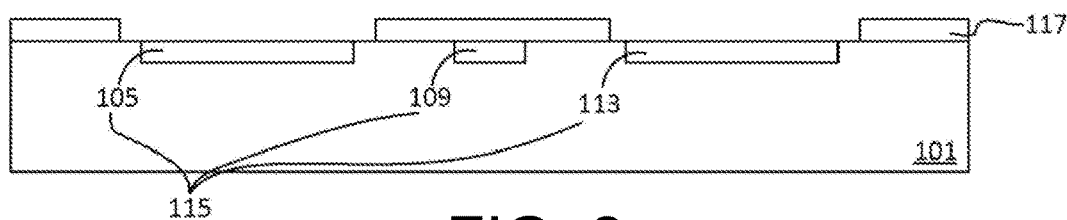

In FIG. 2, the pattern of photoresist 121 may be transferred to hard mask 117 by a suitable etching technique to expose corresponding metal pad 105 and metal pad 113 of the conductive features 115, which will be used to attach components to the substrate 101. The photoresist 121 may be consumed in the etching of hard mask 117, and following the etching of hard mask 117 any portions of the photoresist 121 remaining, may be removed by any suitable technique, such as by an ashing or stripping process using oxygen plasma or the like.

Figure 3:
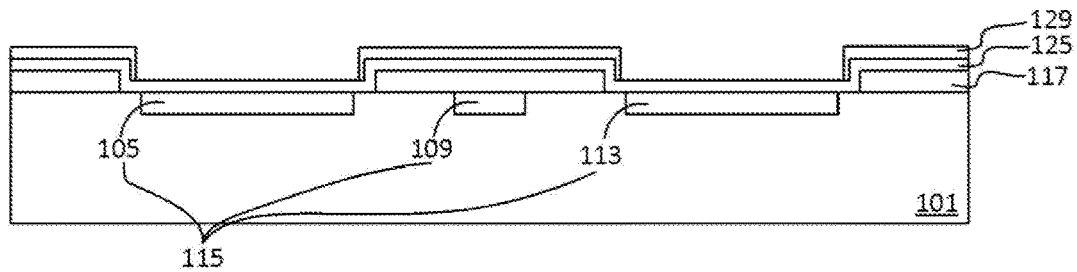

Referring now to FIG. 3, a seed layer 125 is formed over hard mask 117 and any exposed portions through hard mask 117, such as conductive features 115 and portions of substrate 101. In some embodiments, seed layer 125 is a metal layer, which may be a single layer or a composite layer including a plurality of sub-layers formed of different materials. In some embodiments, seed layer 125 includes a titanium layer and a copper layer over the titanium layer. Seed layer 125 may be formed using, for example, PVD or the like. A photoresist 129 is then formed and patterned on seed layer 125. The photoresist 129 may be formed by spin coating or the like and may be exposed to light for patterning. The pattern of the photoresist corresponds to pattern one or more metal pads of the conductive features 115, such as metal pad 105 and metal pad 113, which will be used to attach components to the substrate 101. The patterning forms openings through the photoresist to expose portions of seed layer 125 over the conductive features 115. The openings in photoresist 129 may be bigger than, smaller than, or about the same size as the pattern openings in hard mask 117.

Figure 4:
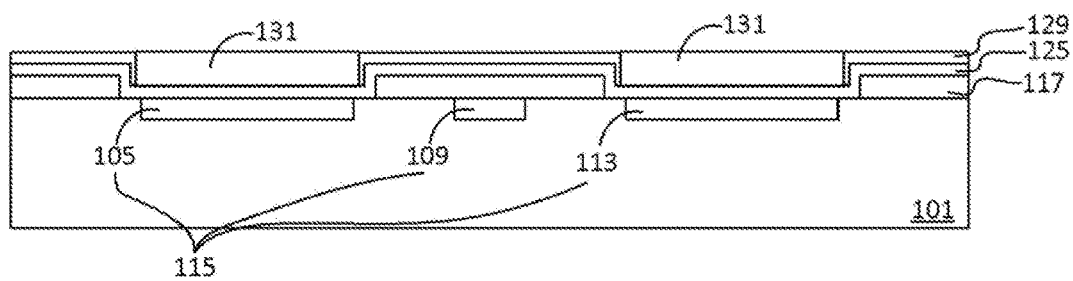

Referring now to FIG. 4, a conductive material 131 is formed in the openings of the photoresist 129 and on the exposed portions of the seed layer 125, thereby forming a bump on each of the exposed metal pads 105 and 113 of the conductive features 115. The conductive material 131 may be formed by plating, such as electroplating or electroless plating, or the like. The conductive material 131 may include a metal, such as silver, a solder alloy, indium, copper, titanium, tungsten, aluminum, or the like.

In FIG. 5, the photoresist 129 and portions of the seed layer 125 on which the conductive material 131 is not formed are removed. The photoresist 129 may be removed by an acceptable ashing or stripping process, such as using an oxygen plasma or the like. Once the photoresist 129 is removed, exposed portions of the seed layer 125 are removed, such as by using an acceptable etching process, such as by wet or dry etching. The remaining portions of the seed layer 125 and conductive material 131 form metal pad 133 and metal pad 137.

FIG. 6 illustrates a top view in accordance with some embodiments. A line A-A illustrates the cross-section used in the views illustrated in FIGS. 1-5, 9-10, 12-13, 15-18, and 21-25. First component attachment area 10A and second component attachment area 10B are outlined by a dashed line. A metal pad 109A is illustrated in phantom (it is not visible) to be in the first component attachment area 10A and metal pad 109B is illustrated in phantom (it is not visible) to be in the second component attachment area 10B. Metal pad 133 is illustrated to be in the first component attachment area 10A and metal pad 137 is illustrated to be in the second component attachment area 10B. While other component attachment areas are illustrated, it should be understood that any number of attachment areas may be included. Also, the substrate illustrated in FIG. 6 may be a portion of a substrate wafer, such as discussed above. Portions of the substrate 101 or hard mask 117 may also be visible, such as illustrated in FIG. 6.

Referring now to FIG. 7, a component substrate 201 is illustrated as being attached to a carrier substrate 205 by an attachment layer 209. In some embodiments, carrier substrate 205 may be a semiconductor substrate made of silicon or another material such as GaAs or the like. In other embodiments, carrier substrate 205 may be a glass carrier substrate, a ceramic carrier substrate, or the like. Carrier substrate 205 may have a thickness between about 50 and 800 μm, such as about 200 μm. Carrier substrate 205 may be a wafer, such that multiple packages can be formed on the carrier substrate 205 simultaneously. Carrier substrate 205 may be part of a chip of multiple component devices. Attachment layer 209 may be formed of a polymer-based material, which may be removed along with carrier substrate 205 from the component substrate 201. In some embodiments, attachment layer 209 is an epoxy-based thermal-release material, which loses its adhesive property when heated, such as a Light-to-Heat-Conversion (LTHC) release coating. In other embodiments, attachment layer 209 may be an ultra-violet (UV) glue, which loses its adhesive property when exposed to UV lights. Attachment layer 209 may be dispensed as a liquid and cured or may be a laminate film laminated onto carrier substrate 205. The top and bottom surfaces of attachment layer 209 may have a high degree of co-planarity.

The component substrate 201 may include active or passive devices in one or more layers. In some embodiments, the component substrate 201 may include one or more layers which are previously formed and attached to carrier substrate by attachment layer 209. Additional processing may then be performed to create additional layers, devices, and/or other features. In other embodiments, the layers of component substrate 201 are formed on the carrier substrate 205 using the carrier substrate 205 as a platform for forming component substrate 201 by depositing or forming the various layers of the component substrate 201, examples of which are described below. In such embodiments, an etch stop layer 210 rather than an attachment layer 209 may be formed between the carrier substrate 205 and component substrate 201. The etch stop layer 210 may include a dielectric material, such as silicon nitride, silicon oxide, silicon ox nitride, or the like, having a different etch rate than the material of the first layer of the component substrate 201. In some embodiments, the etch stop layer 210 is an epitaxy growth material by Metal-Organic Chemical Vapor Deposition (MOCVD), such as InGaP, AlAs, or InP, which has strong chemical etch resistance while subsequently removing substrate 205 by etching and protecting the layers of component substrate 201.

Component substrate 201 may include a silicon or GaAs substrate (although, other suitable substrates may be used) which may have doped and/or undoped portions formed therein. Layers (e.g., layers L1 through L11) of component substrate 201 may also include metals, dielectrics, semiconductor group III-V epitaxial layers, and so forth. Each layer of component substrate 201 may be between about 30 nm and about 300 nm, such as about 70 nm. Component substrate 201 may any number of suitable layers, such as between 2 and 100 layers, such as 60 layers. An overall thickness of the component substrate 201 may be between about 2 μm and 30 μm, such as about 10 μm. Other dimensions for layers of component substrate 201 are contemplated and may be used. The layers of the component substrate 201 may form component devices within the structure of the component substrate 201. The component devices may include devices such as diodes, laser diodes, light emitting diodes (LEDs), metal-insulator-metal diodes, power amplifiers, or other semiconductor devices. Candidate components may include any combination of the above as appropriate.

Figure 7A:
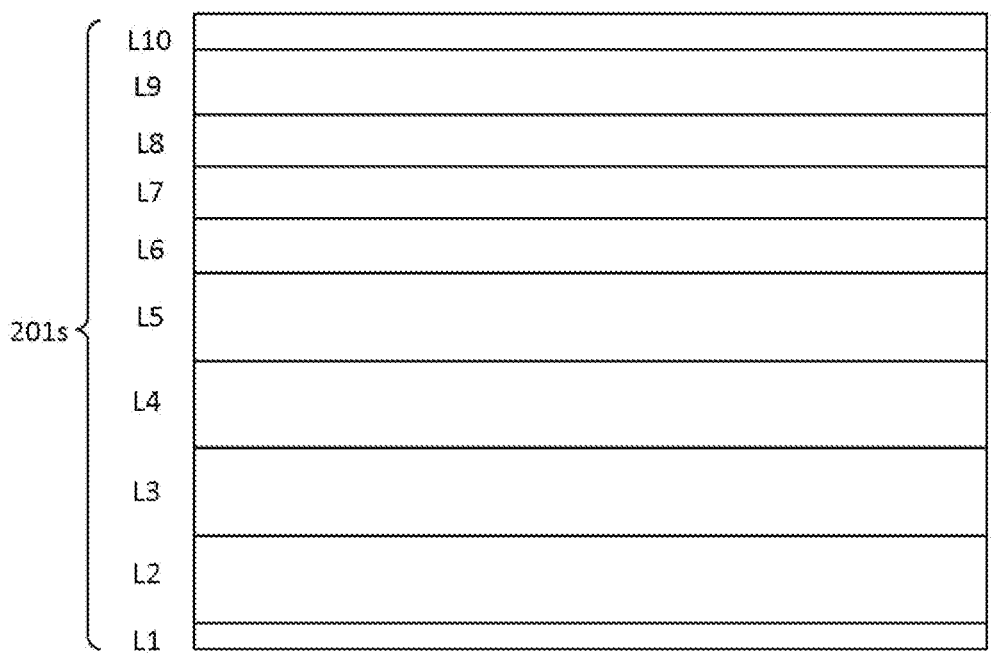
FIG. 7a illustrates an example component device, in accordance with some embodiments.

Referring to FIG. 7a, an LED device is illustrated as a non-limiting example of one specific component substrate 201s that may be formed for component substrate 201, in accordance with some embodiments. One of skill in the art will understand though that this is merely an example of a LED and additional layers or different layers may be used to form an LED. Also, although example thicknesses for each of the layers described below are provided, one should understand that these layers may be thicker or thinner than specified below based on the needs and characteristics of the device being formed. One should also understand that additional layers may be provided as needed, including multiple identical layers stacked on one another to build up a desired thickness.

Layer L1 of component substrate 201s may be an ohmic layer for the LED device, such as an LED cathode, for example, p-type P– doping of a GaN layer. Layer L1 may be, for example, about 50 nm to about 200 nm thick. Layers L2 through L5 of component substrate 201s may include AlGaN about 300 nm thick for each, and each having a different Al composition between about 10% to 90%. Layer L6 of component substrate 201s is a multiple quantum well layer (MQW), and MQW may a layer of InGaN about 50 nm to 200 nm thick. Layers L7 through L10 of component substrate 201s may be n-type P– doping of a GaN layer each between about 50 nm to about 200 nm thick. Layers L1-L10 of component substrate 201s may together include an active portion of the LED.

Other possibilities for the layers of component substrate 201 are contemplated, including layers for forming devices such as diodes, laser diodes, light emitting diodes (LEDs), metal-insulator-metal diodes, power amplifiers, surface mount devices, integrated package devices, or other semiconductor devices.

Referring back to FIG. 7, the component devices may be formed within the component substrate 201 such that each of the component devices has a first electrode disposed at one surface of the component substrate 201 and a second electrode disposed at the opposite surface of the component substrate 201. Outermost layers of the component substrate 201 may include dielectric layers to protect the electrodes of the component devices.

FIG. 8 illustrates the formation of contact 219 and contact 223 on the component substrate 201. Contact 219 corresponds to a first contact of a particular component and contact 223 corresponds to a first contact of another particular component formed within the component substrate. The individual components may be singulated in a further processing step, described below. Contact 219 and contact 223 may be formed by exposing corresponding electrodes of the component substrate 201 by a photo-patterning process, depositing a seed layer, and electroplating conductive material on the seed layer, in a process similar to that described above with respect to metal pad 133 and metal pad 137 (see FIG. 5). Other suitable processes may be used to form contact 219 and contact 223. One of skill will understand that other contacts may be formed for other components in like manner. The materials of contact 219 and contact 223 may include Au, Ni, Ge, GeAu, Al, Ti, Pt, solder the like, or combinations thereof. In some embodiments the width of contact 219 and contact 223 may be between about 3 and 45 μm, such as about 8 μm. In some embodiments the thickness of contact 219 and contact 223 may be between about 0.1 and 5 μm, such as about 0.5 μm. Other dimensions for contact 219 and contact 223 are contemplated and may be used.

Figure 9:
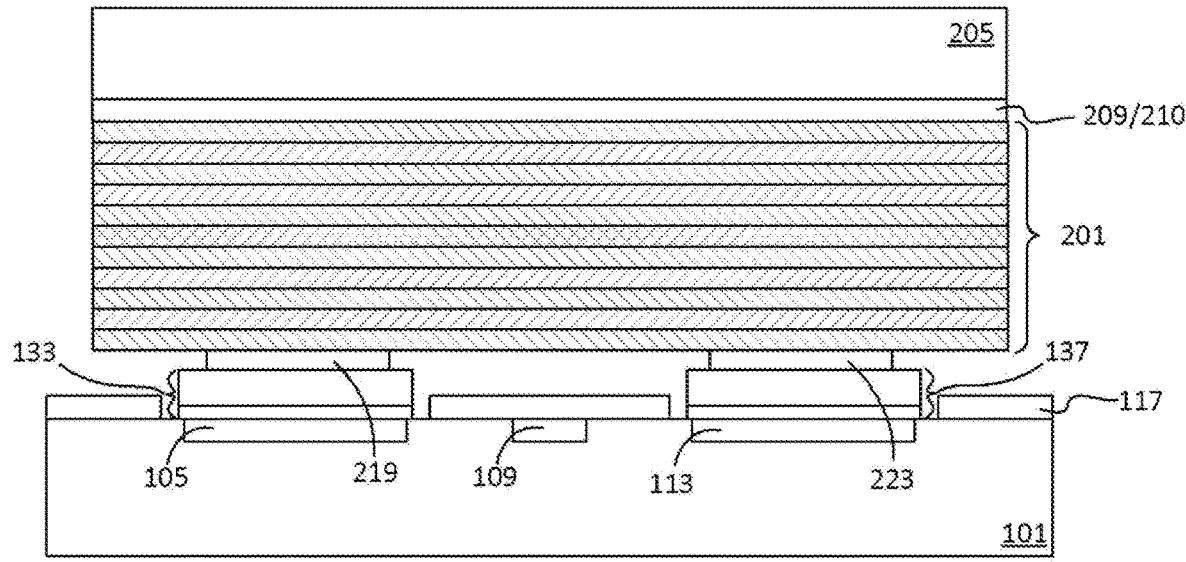

Referring now to FIG. 9, the contact 219 of the component substrate 201 is bonded to the metal pad 133 of substrate 101 and the contact 223 of the component substrate 201 is bonded to the metal pad 137 of substrate 101. The contact 219 of the component substrate 201 is aligned to the metal pad 133 on the substrate 101 and the contact 223 of the component substrate 201 is aligned to the metal pad 137 on the substrate 101. In some embodiments, a solder material may be used between the contact 219 and the metal pad 133 and between the contact 223 and the metal pad 137. In other embodiments, the contact 219 may be directly bonded to the metal pad 133 and the contact 223 may be directly bonded to the metal pad 137 without using a eutectic material (e.g., solder) such that the interface between the contact 219 and metal pad 133 and the interface between the contact 223 and metal pad 137 are free of eutectic material.

Figure 10:
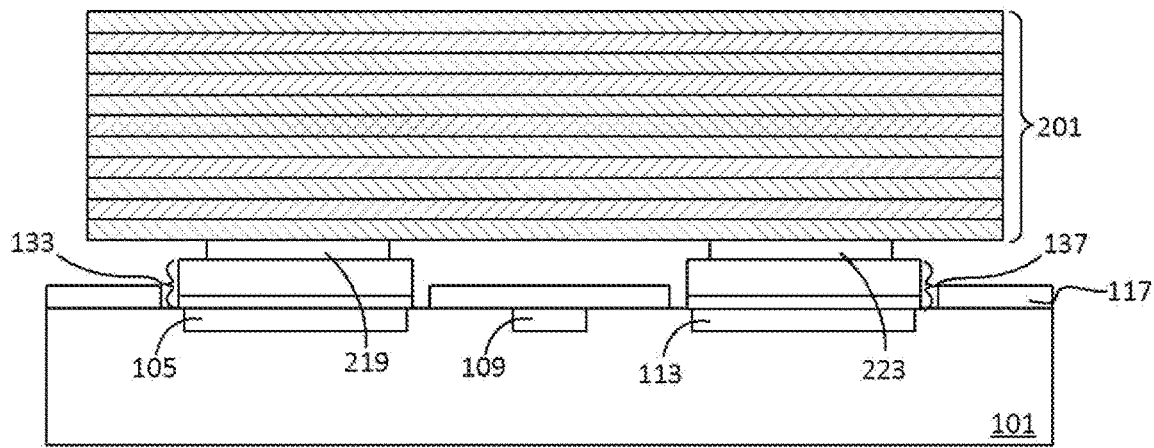

Referring now to FIG. 10, the carrier substrate 205 is removed. In some embodiments, carrier substrate 205 may be removed by degrading attachment layer 209, thereby releasing carrier substrate 205. In other embodiments, carrier substrate 205 may be removed by a chemical etch process and etch stop layer 210 may be used to prevent damage of underlying component devices. Following removal of the carrier substrate 205 by a chemical etch process, etch stop layer 210 may be removed by a further etch process. In some embodiments, the carrier substrate 205 may be removed by other appropriate means, such as by a chemical mechanical process (CMP) or other suitable means.

Figure 11:
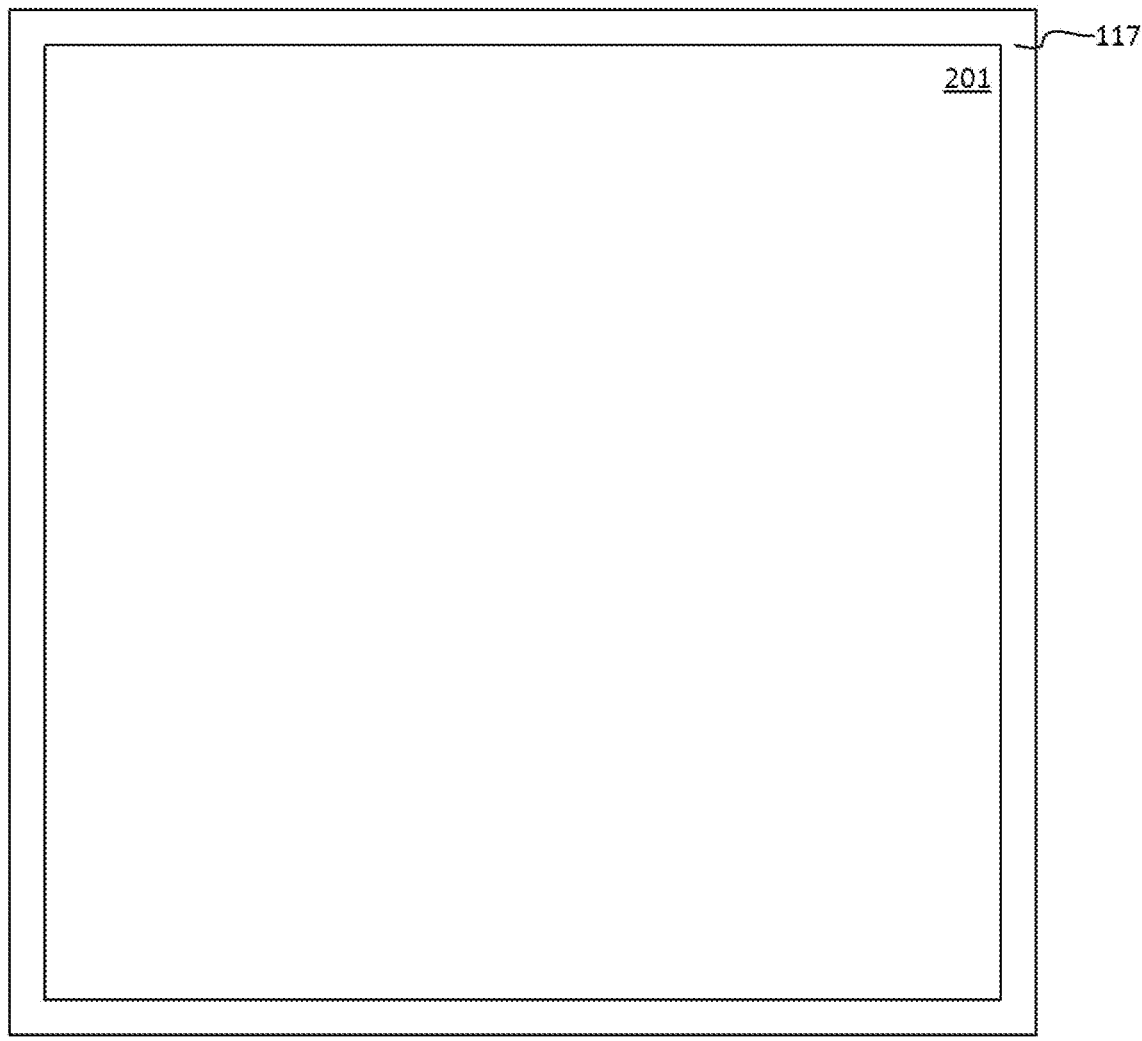

FIG. 11 illustrates a top view of the device of FIG. 10. Component substrate 201 is illustrated as a chip, however component substrate 201 may be part of a wafer. Portions of hard mask 117 or substrate 101 may also be visible.

Figure 12:
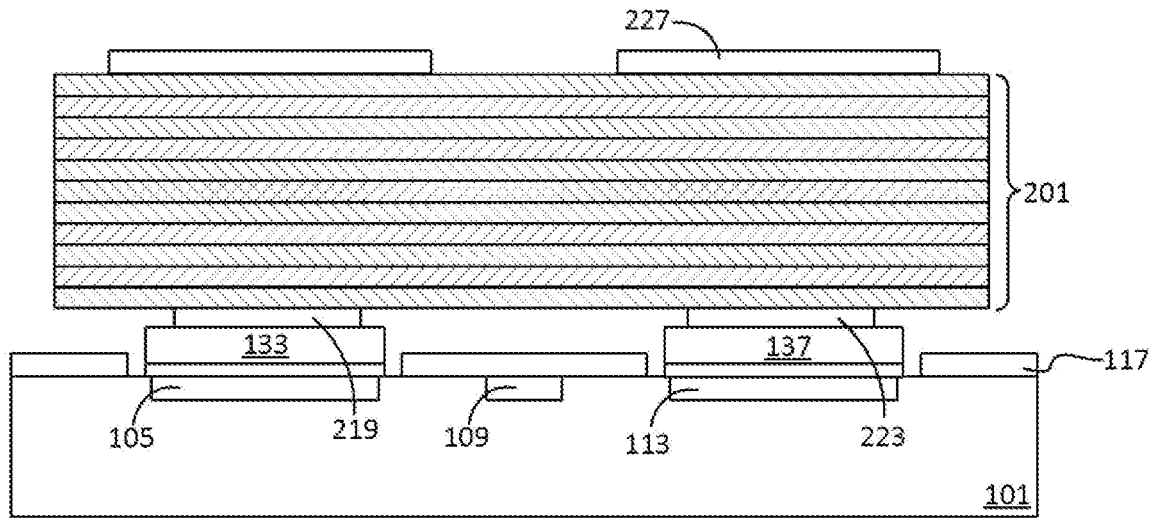

Referring now to FIG. 12, a dielectric layer 227 is formed over the component substrate 201 and patterned. Dielectric layer 227 may be formed using materials and processes similar to those described above with respect to hard mask 117 of FIG. 1, which are not repeated. Dielectric layer 227 may be patterned using a suitable patterning process, such as the patterning process described above with respect to FIG. 1. Dielectric layer 227 may have a thickness between about 0.2 µm and about 5 µm, such as about 2 µm, although other thicknesses are contemplated. Dielectric layer 227 may be used as a mask which defines portions of component substrate 201 which are to become singulated components attached to substrate 101. Portions of component substrate 201 which are exposed from the dielectric layer 227 are to be removed in subsequent processing.

Figure 13:
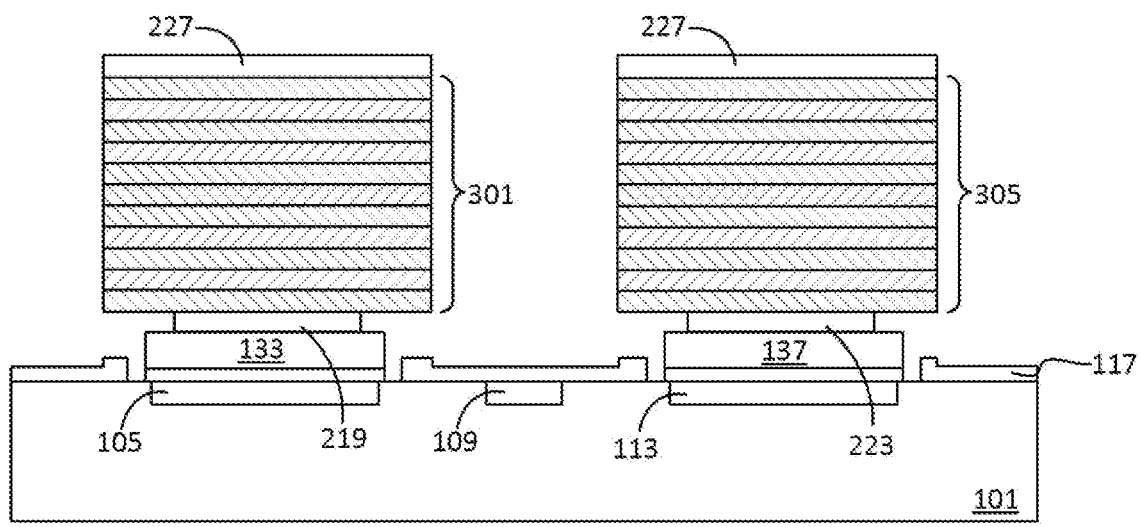

FIG. 13 illustrates singulated component device 301 and component device 305 following a singulation process which separates component devices from the component substrate 201. In some embodiments, a dry etch is used to transfer the pattern of dielectric layer 227 to each layer of component substrate 201. In some embodiments, hard mask 117 may also be completely or partially etched according to the pattern of dielectric layer 227. Other suitable etching processes may be used. Following etching the component substrate 201 to form component device 301 and component device 305, a cleaning process may be used to remove residue resulting from the etching. Following etching the component substrate 201, the dielectric layer 227 may optionally be removed. In some embodiments, component device 301 and/or component device 305 may include multiple component devices which are joined in clusters of two or more component devices. It should be understood that while two component devices are illustrated, additional component devices may be formed in other areas of the substrate 101 which are not illustrated.

Figure 14:
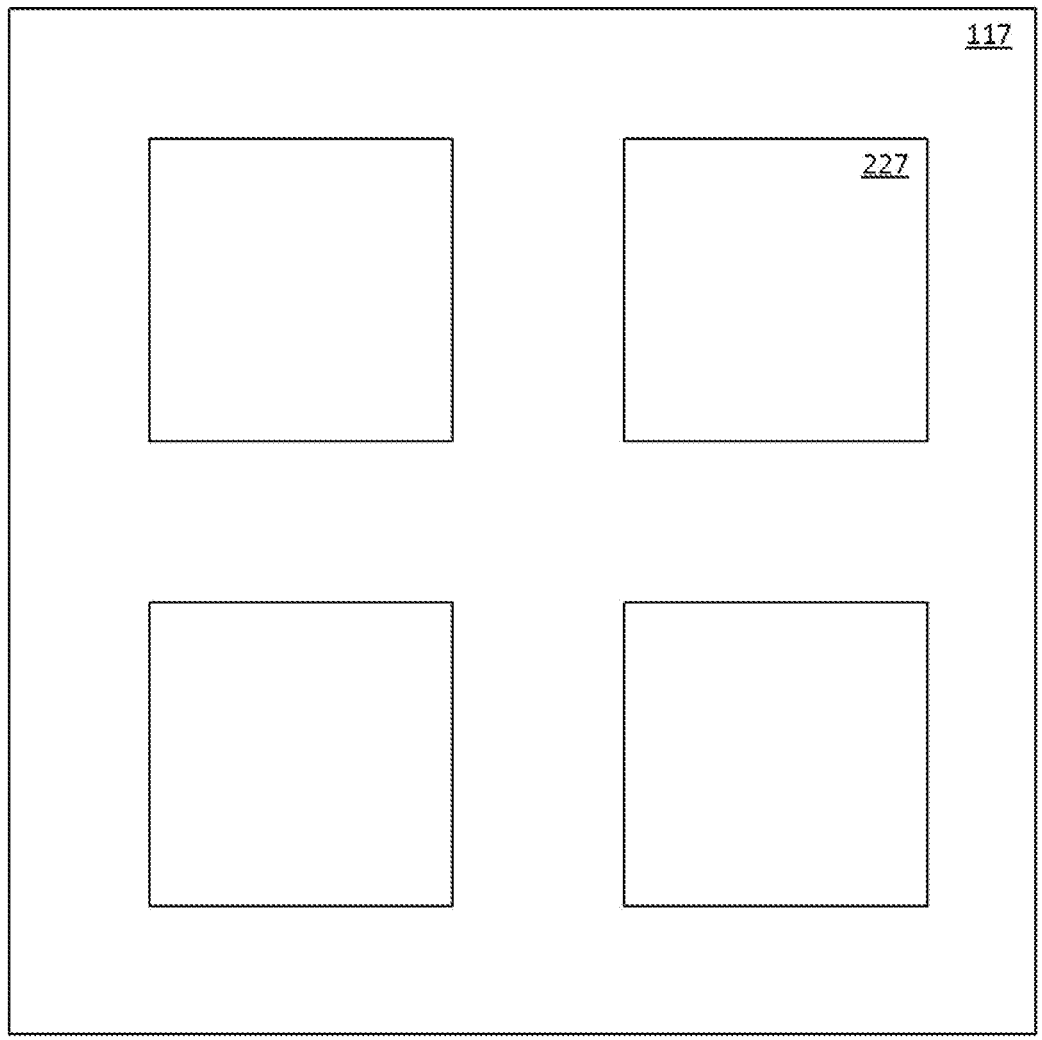

FIG. 14 illustrates a top view of the device of FIG. 13. Dielectric layer 227 over component device 301 and component device 305 is visible and outlines the lateral extents of each of component device 301 and component device 305, which are disposed over respective metal pad 105 and metal pad 113 of substrate 101. Portions of hard mask 117 or substrate 101 may also be visible.

Figure 15:
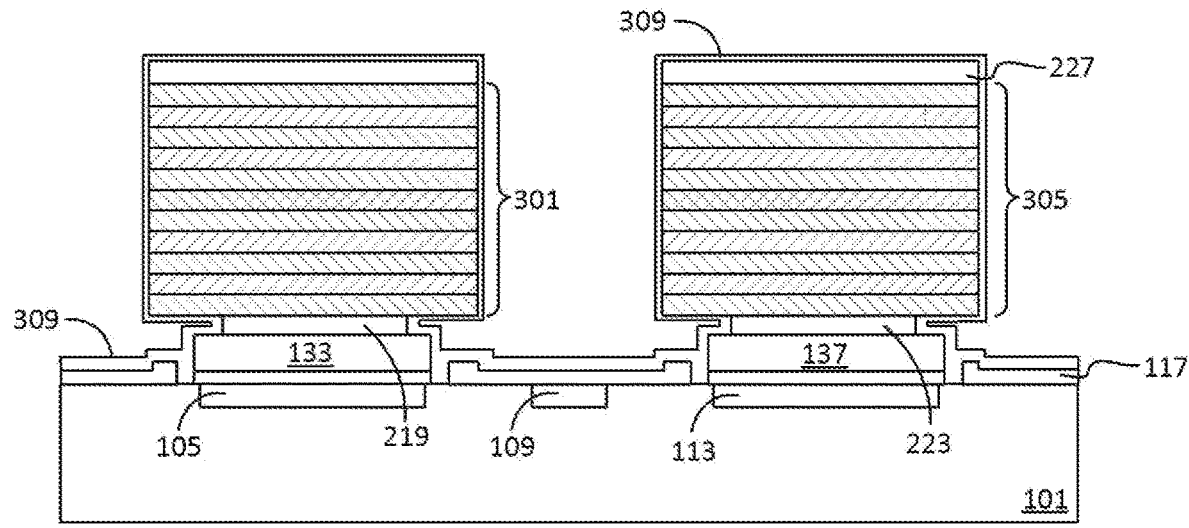

Referring now to FIG. 15, a protective dielectric film 309 is formed surrounding component device 301 and component device 305. The protective dielectric film 309 may include any suitable dielectric material, such as for example, $Al_2O_3$, AlN, SiN, SiOx, other suitable dielectrics, or multi-layer combinations thereof. The protective dielectric film 309 may be formed using any suitable deposition technique, including for example chemical vapor deposition (CVD), plasma-enhanced CVD (PECVD), atomic layer deposition (ALD), and the like. The protective dielectric film 309 may be deposited to a thickness between 0.05 µm and 0.2 µm, such as about 0.1 µm, although other thicknesses are contemplated.

Figure 16:
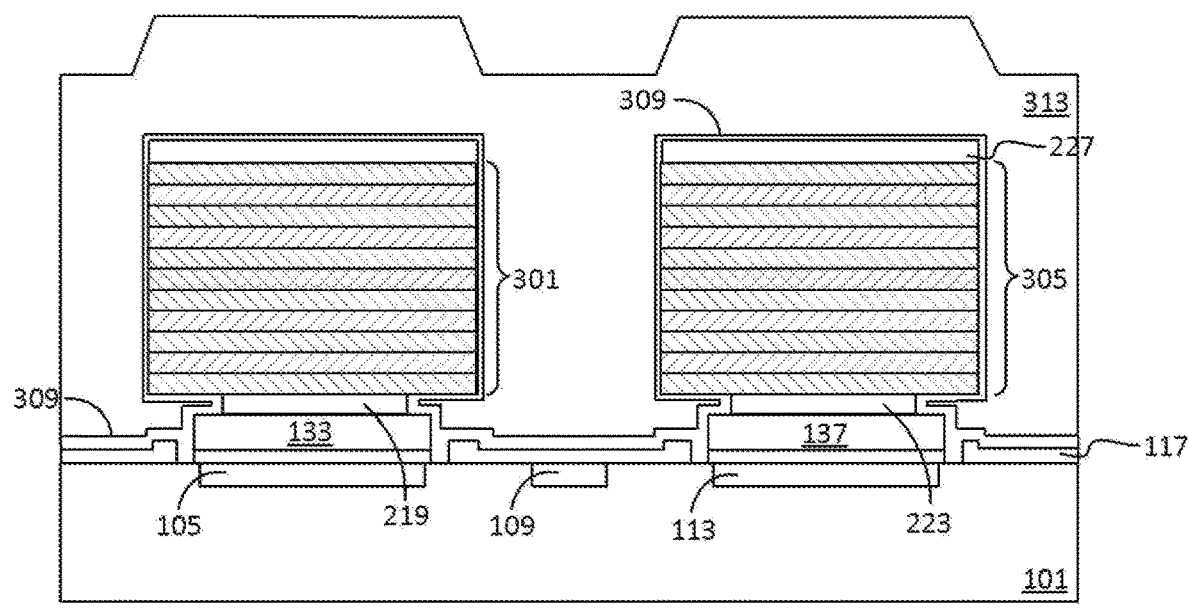

In FIG. 16, a gap fill material 313 is deposited over the whole structure, thereby encapsulating component devices 301 and 305. Component devices 301 and 305 may be completely encapsulated, both laterally (around the sides of) and vertically (over the top of). The gap fill material 313 may include, for example, a polymer, such as polyimide, polybenzoxazole (PBO), benzocyclobutene (BCB), and so forth deposited by a spin coating or other suitable process. In some embodiments the gap fill material 313 may be another insulating material, such as $SiO_x$ or another suitable material. The gap fill material 313 may be deposited by any suitable process, such as by CVD or the like.

Figure 17:
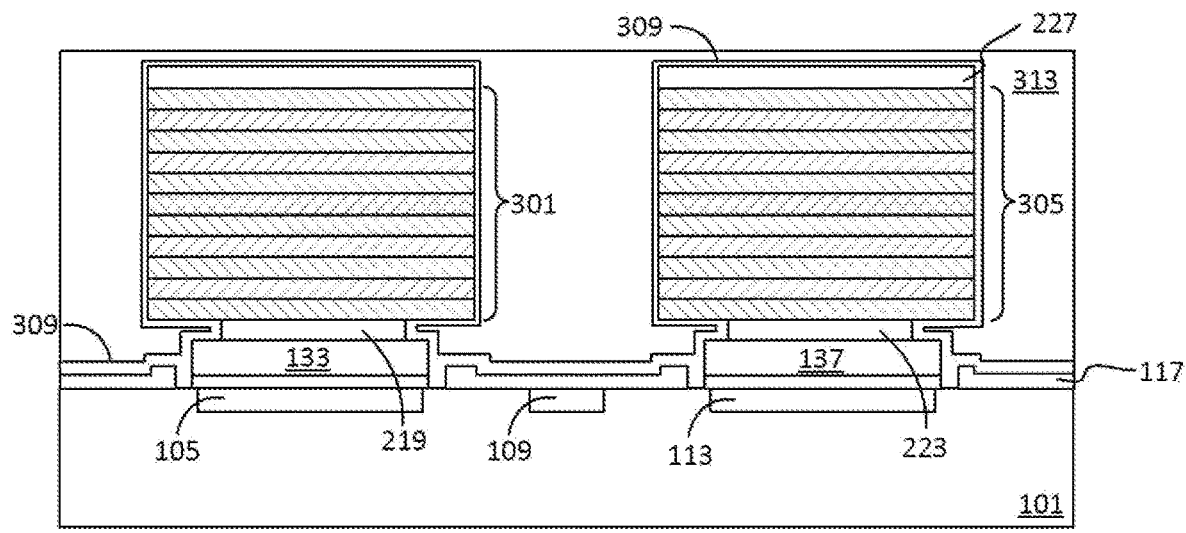

Referring now to FIG. 17, the structure of FIG. 16 is planarized to level the top of the gap fill material 313. In some embodiments, a portion of the gap fill material 313 may remain over component device 301 and component device 305, while in other embodiments, the top of the gap fill material 313 may be planarized such that the uppermost surface of the gap fill material 313 and the uppermost surfaces of the component devices 301 are level. Planarization may be performed by any suitable means, such as by CMP, or the like.

Figure 18:
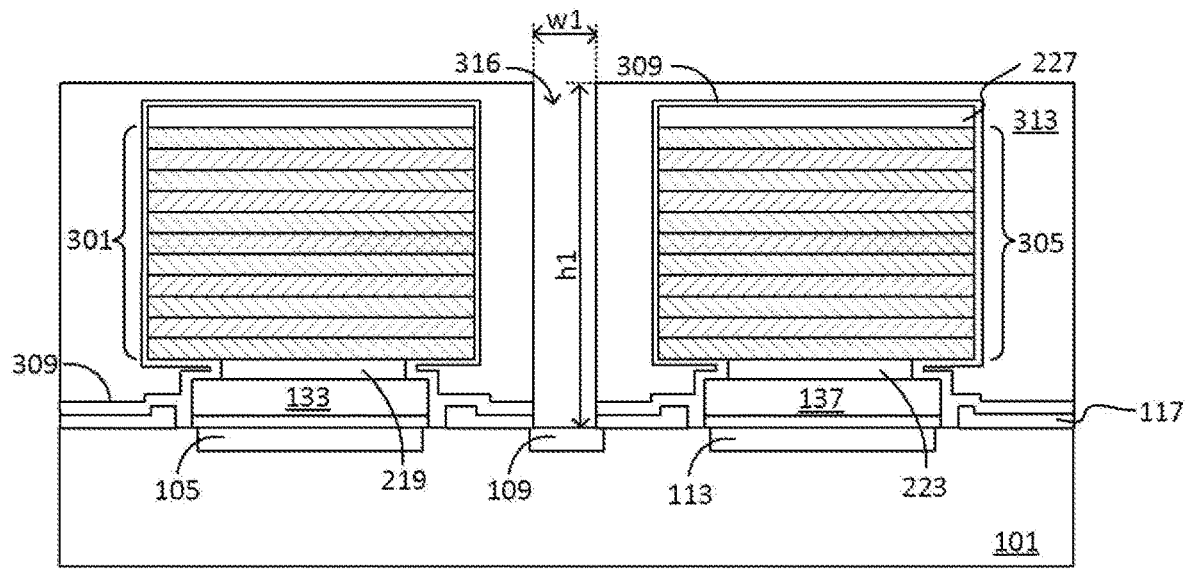

Referring now to FIG. 18, a via opening 316 is formed adjacent to one of the component devices 301 and/or 305 (for example, between two adjacent component devices, such as illustrated in FIG. 18). Via opening 316 exposes corresponding metal pad 109. In some embodiments, other via openings may be formed, including adjacent to via opening 316. The additional via openings may be used to couple to form vias from corresponding metal pads in substrate 101. Via opening 316 may be made by any suitable photo-patterning process, an example of which is described above with respect to FIG. 1. For example, a photoresist (not shown) is deposited over the gap fill material 313, the photoresist patterned to form openings therein which correspond to the via openings to be formed, such as via opening 316, and a dry etch process is used to extend the openings of the photoresist through the gap fill material 313 to expose corresponding metal pads of the substrate 101 (see FIG. 1), such as metal pad 109. In some embodiments, the via openings may have sidewalls comprising the gap fill material 313, while in some embodiments, the protection dielectric film 309 on sidewalls of the components may be exposed during the via opening etch and serve as one or more sidewalls of the via opening 316. The etch process may be anisotropic so that the sidewalls of the via openings including via opening 316 are vertical, within process variations. Via opening 316 may have a width w1 or critical dimension of about 0.5 µm to about 10 µm, such as about 1 µm and a height h1 of about 1 µm to about 100 µm, such as about 10 µm, although other dimensions are contemplated. Via opening 316 may have high aspect ratio of height to width between about 2 and 10, such as about 5.

Figure 19:
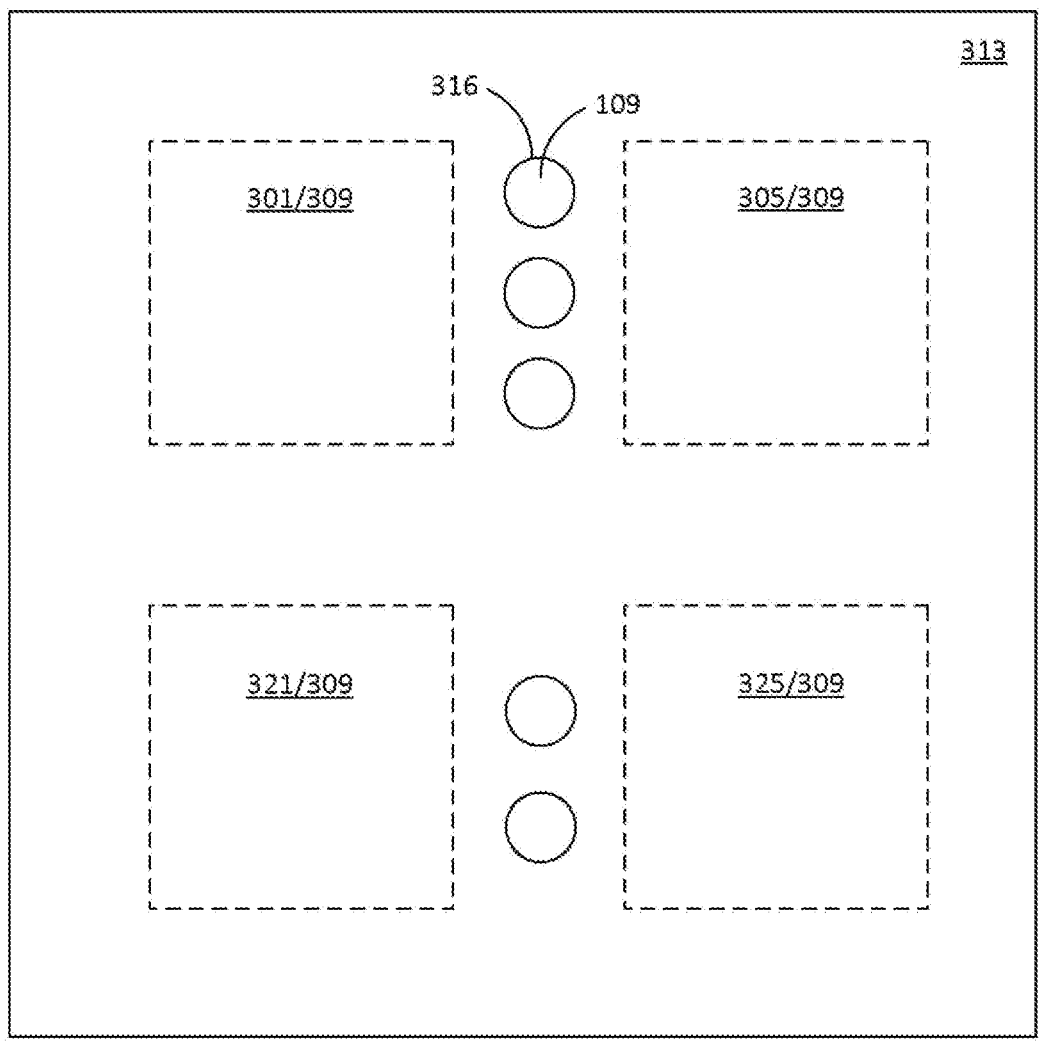

FIG. 19 illustrates a top view of the device of FIG. 18, in accordance with some embodiments. In particular, FIG. 19 illustrates three via openings 316 formed between component device 301 and component device 305. FIG. 19 also illustrates two via openings 316 formed between component device 321 and component device 325. Any number of via openings may be formed, depending on sizing and electrical requirements for each of the component devices. For example, it may desirable to provide additional power to some of the component devices such that multiple via openings 316 are intended to be used by some of the component device.

Figure 20:
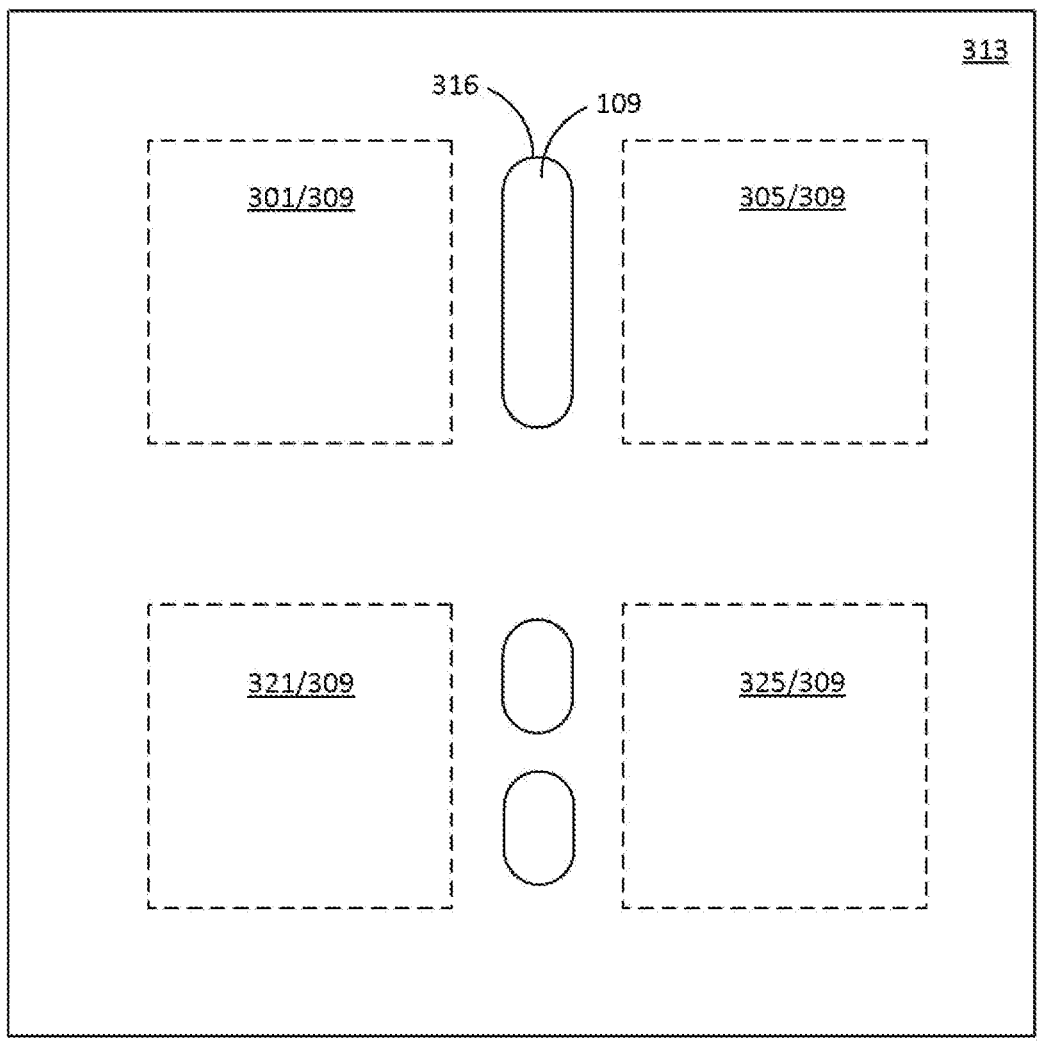

FIG. 20 illustrates a top view of the device of FIG. 18, in accordance with some embodiments. In particular, FIG. 20 illustrates that via openings 316 may be oblong as well, which may also correspond to an oblong underlying metal pad, such as metal pad 119 (see FIG. 18). Via openings 316 (as well as their corresponding underlying metal pads) may be formed in any suitable shape in top view, such as circular, square, rectangular, elongated, and so forth.

Figure 21:
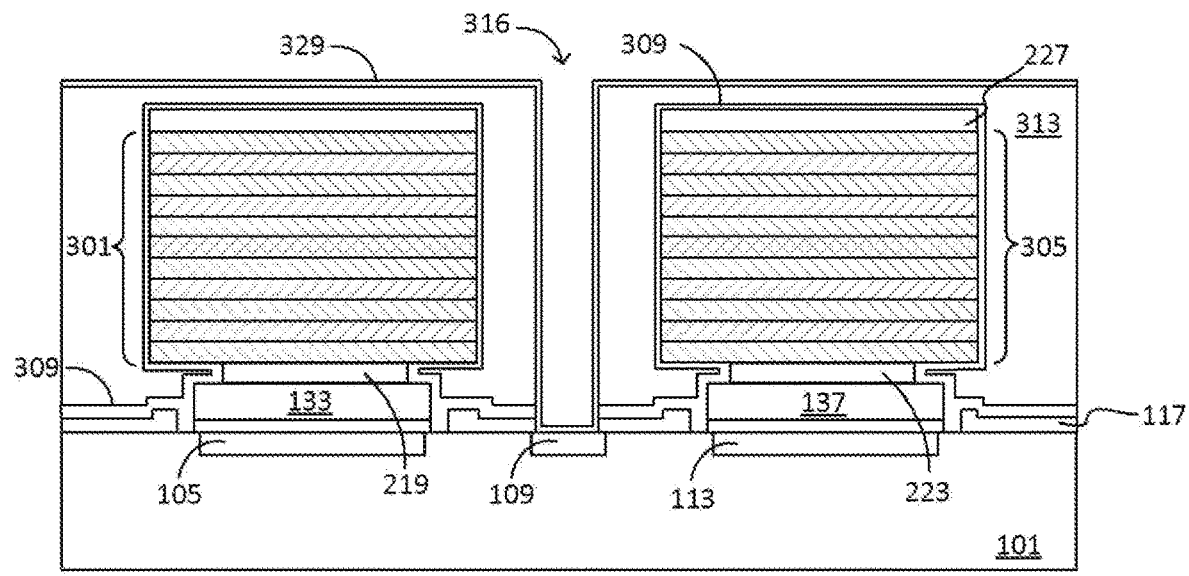

Referring now to FIG. 21, a diffusion barrier 329 is deposited over the structure and into via opening 116. The diffusion barrier 329 prevents the material of the subsequently formed via from leeching or diffusing into the surrounding gap fill material 313. The diffusion barrier 329 may be formed of Ti, TiN, TaN, other suitable materials, or multi-layer combinations thereof. The diffusion barrier 329 may be formed by sputtering or other suitable deposition techniques, such as by CVD, PECVD, ALD, or the like.

Figure 22:
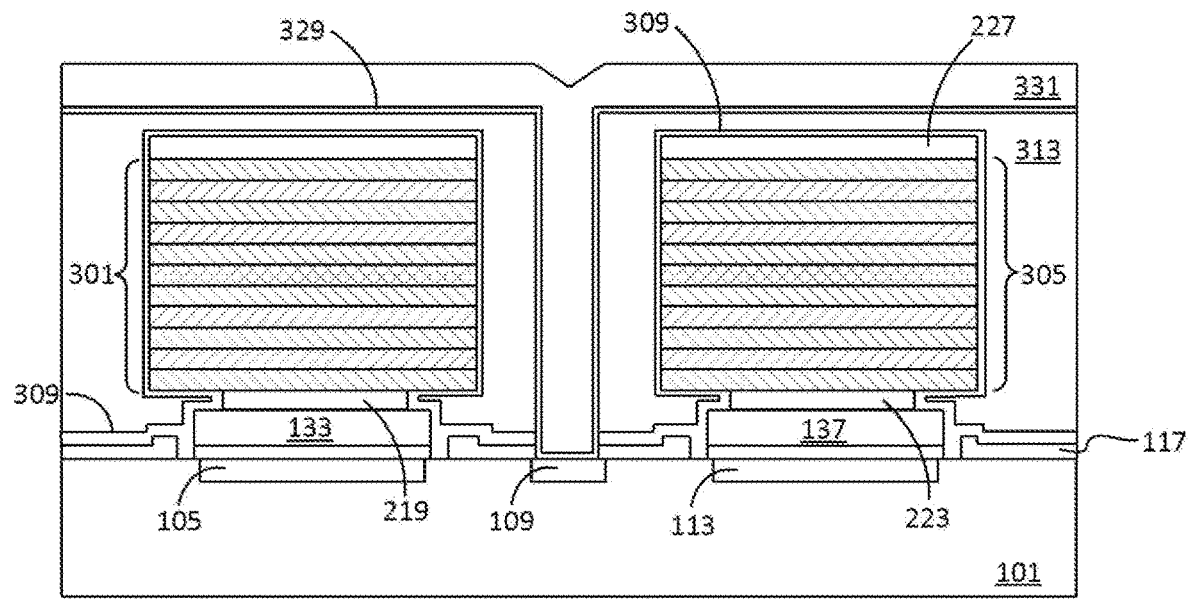

Following the formation of the diffusion barrier, in FIG. 22, the via opening 316 (see FIG. 21) is filled by a conductive material through a plating process, thereby forming a conductive fill 331 in the via opening 316 and over the gap fill material 313 and component devices (including component device 301 and component device 305), in accordance with some embodiments. The conductive fill 331 may include copper or other suitable metallic materials such as W or Al. Other suitable deposition techniques may be used.

Figure 23:
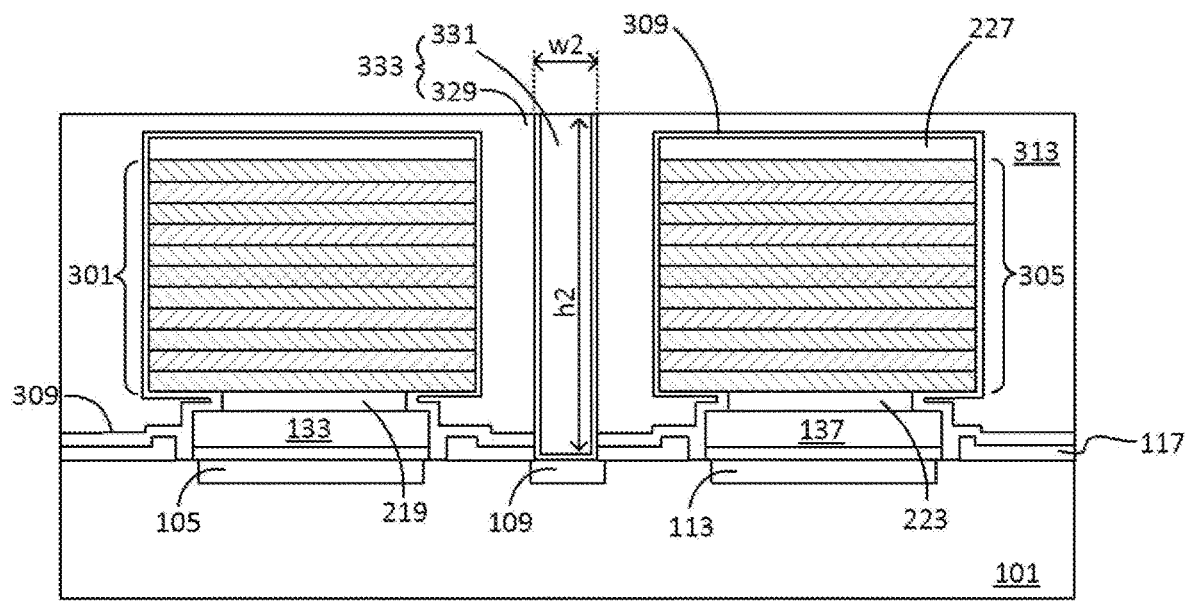

Referring to FIG. 23, a planarization process may be used to level the top surface of the conductive fill 331 and diffusion barrier 229 with the top surface of the gap fill material 313. The planarization process will also remove portions of the conductive fill 331 and portions of the diffusion barrier 329 which extend beyond the via opening 316 (see FIG. 21). The diffusion barrier 329 and conductive fill 331 together form a conducive via 333. Conductive via 333 may have a width w2 or critical dimension be between about 0.5 μm and about 10 μm, such as about 1 μm, and a height h2 between about 1 μm and about 100 μm, such as about 10 μm, although other dimensions are contemplated. Conductive via 333 may have high aspect ratio of height to width between about 2 and 10, such as about 5. Any suitable planarization process may be used, including a CMP or etching process, or combinations thereof, depending on the conductive material of via 333. In some embodiments, the planarization process may level the top surface of the conductive fill 331 and diffusion barrier 229 to the top surface of the protective dielectric film 309 or top surface of the dielectric layer 227. Following formation of via 333, the top of the component devices 301 and 305 may be closer to the substrate 101 than the top of the via 333. In other words, the top of via 333 may protrude further from the substrate 101 than the component devices 301 and 305.

Figure 24:
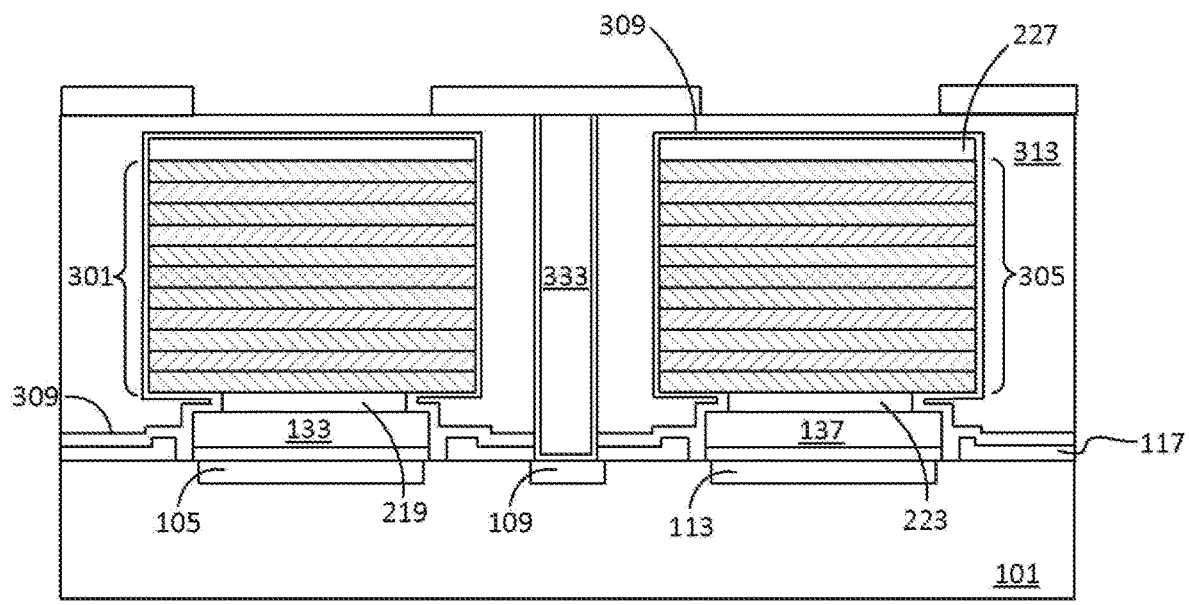
Figure 25:
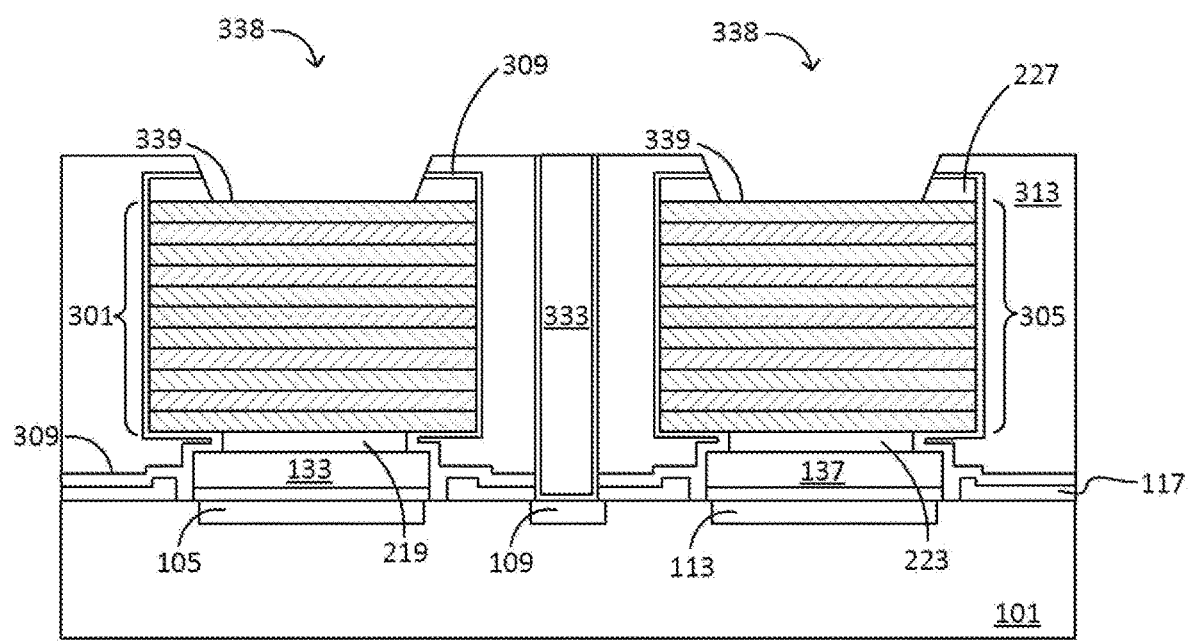

Referring to FIGS. 24 and 25, the top of the component device 301 and component device 305 are exposed by a photo-patterning and etching process. In FIG. 24, a photoresist 337 is deposited and patterned using materials and processes similar to those described above with respect to FIG. 1. The pattern of photoresist 337 corresponds to underlying component devices, such as component device 301 and component device 305. In FIG. 25, an upper electrode 339 (e.g., the uppermost layer or a portion thereof) of the component devices, including component device 301 and component device 305 are exposed by a suitable etching process. Portions of the gap fill material 313 (if any), protective dielectric film 309, and dielectric layer 227 may be removed to form openings 338 which expose upper electrodes 339 of the component devices.

Figure 26:
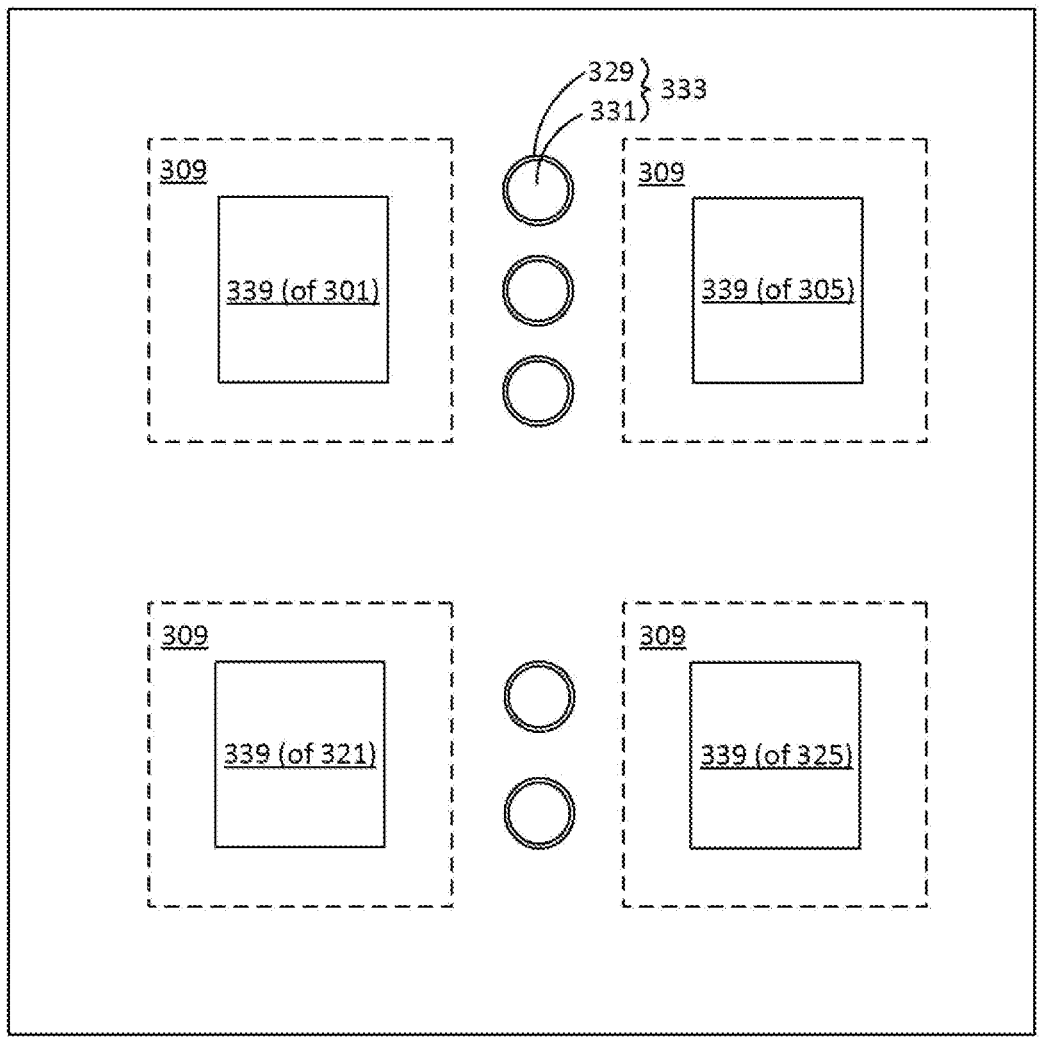

FIG. 26 illustrates a top view of the structure of FIG. 25, in accordance with some embodiments. Outlines of the lateral extents of component device 301, component device 305, component device 321, and component device 325 are shown in a dashed line. The layout illustrated in FIG. 26 is similar to the layout which was illustrated in FIG. 19, though one of skill in the art will understand that other layouts are contemplated, such as the layout in FIG. 20 or layouts which are illustrated in FIGS. 29 through 32 and the like.

Figure 27:
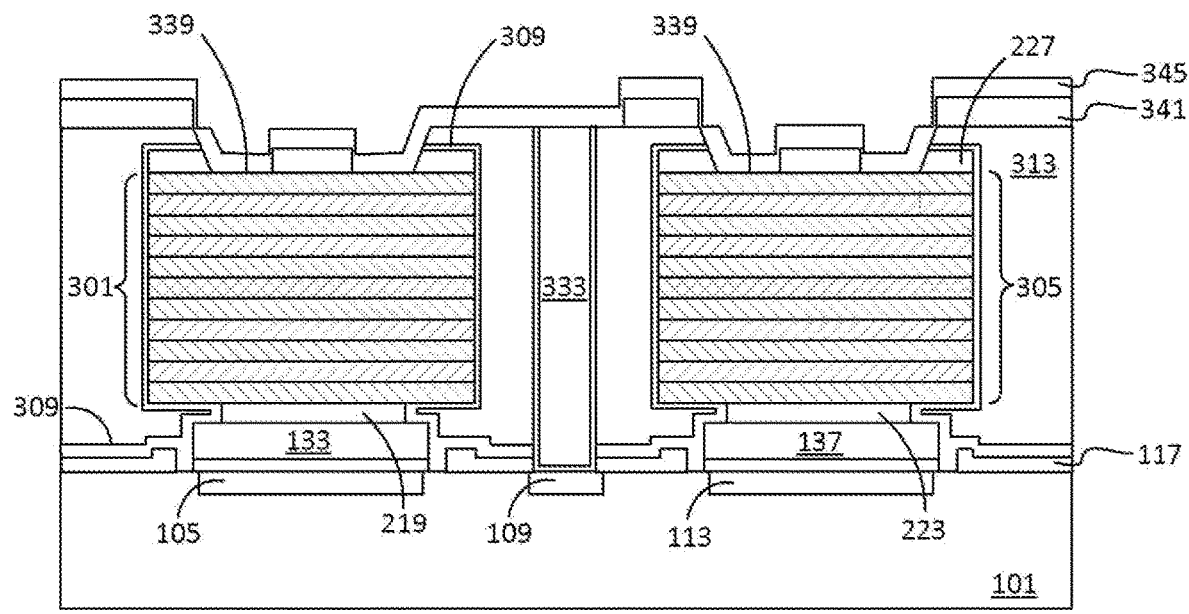

Referring to FIG. 27, a conductive bridge layer 345 is formed over the structure to bridge the upper electrodes 339 of the component devices to the uppermost surfaces of the vias 333. In some embodiments, a photoresist 341 may be deposited prior to the conductive material of the conductive bridge layer 345 and patterned where the openings in the pattern correspond to the desired layout of the conductive bridges (see FIG. 28) of the conductive bridge layer 345. The conductive bridge layer 345 may be formed of a conductive material, such as copper, titanium, platinum, silver, aluminum, gold, other suitable materials, or multi-layer combinations thereof. The conductive bridge layer 345 may be formed by evaporate deposition, sputtering, CVD, or other suitable process.

Figure 28:
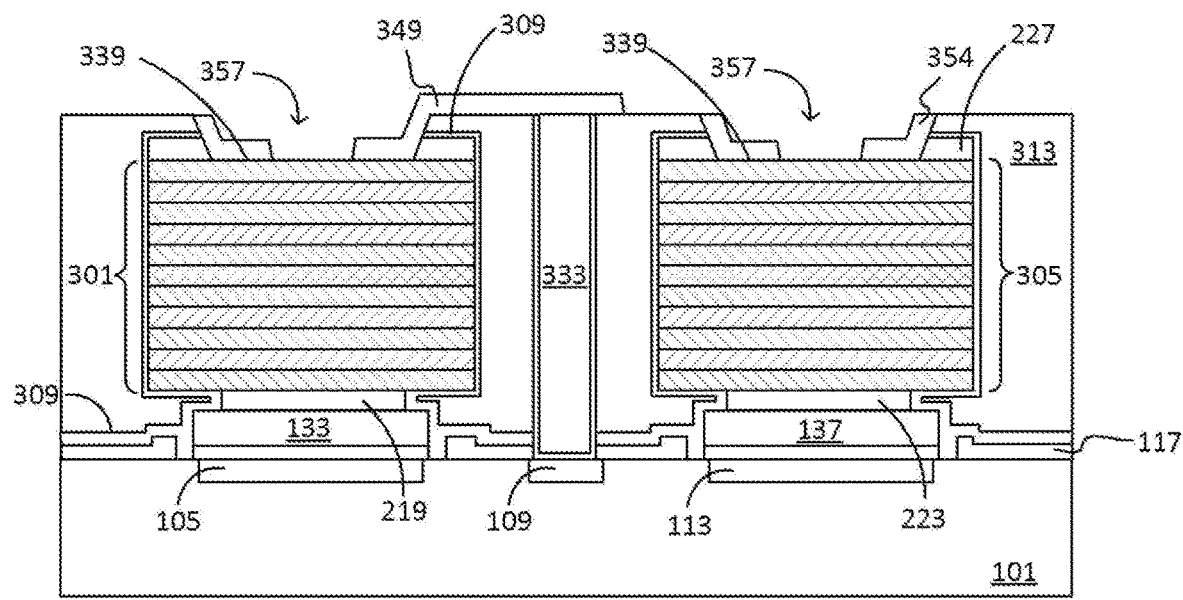

Referring to FIG. 28, following the formation of the conductive bridge layer 345, the photoresist 341 may be removed, such as by stripping or ashing, thereby also removing portions of the conductive bridge layer 345 which are not used and forming conductive bridge 349 and conductive bridge 354. In some embodiments, the conductive bridges may be formed to partially cover the upper electrodes 339 of the component devices, including component device 301 and component device 305. In some embodiments portions of the upper electrode 339 of the component devices may remain uncovered by the conductive bridges, such as conductive bridge 349 and conductive bridge 354. For example, in embodiments where component device 301 or component device 305 is an LED, a light emitting part 357 may remain exposed from the conductive bridge 349 and conductive bridge 354. The conductive bridge 349 and conductive bridge 354 may fully or partially surround, but not cover, the light emitting part 357. For example, FIG. 29 discussed below illustrates component device 301 and component device 305 which have portions of the upper electrodes 339 remaining uncovered by a corresponding conductive bridge 349 and conductive bridge 354, respectively. In some embodiments, the conductive bridges may span multiple component devices. For example, FIG. 31 discussed below illustrates component device 361 and component device 365 which are bridged together by a common conductive bridge 369.

Figure 27A:
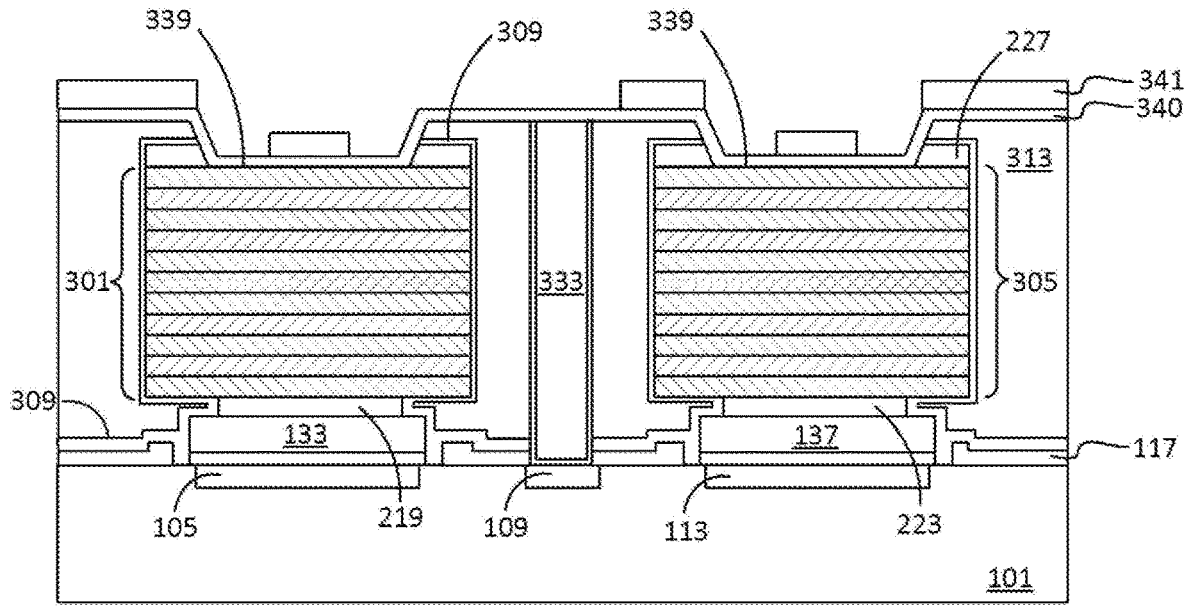
Figure 28A:
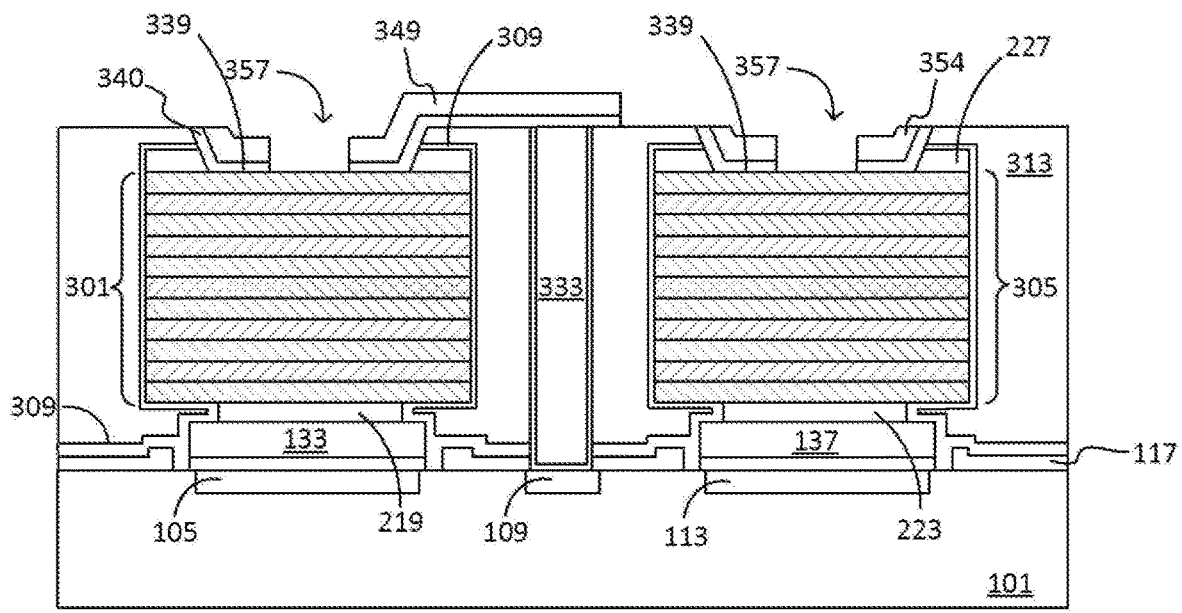

Referring now to FIGS. 27a and 28a, FIGS. 27a and 28a illustrate the formation of conductive bridges in accordance with other embodiments. In some embodiments, conductive bridge 349 and conductive bridge 354 may be formed as described above with respect to FIG. 27. In other embodiments, a seed layer 340 may be formed in the openings 338 (see FIG. 25) and over gap fill material 313. The seed layer 340 may be a single metal layer or a composite metal layer comprising a plurality of sub-layers formed of different materials. The seed layer 340 may be formed using, for example, PVD or the like. A photoresist 341 is then formed and patterned on the seed layer 340. The photoresist 341 may be formed by spin coating or the like and may be exposed to light for patterning. The pattern of the photoresist 341 corresponds to the negative pattern of the conductive bridges to be formed. The patterning forms openings through the photoresist 341 to expose the seed layer 340.

Referring to FIG. 28a, following from FIG. 27a a conductive material is formed in the openings of the photoresist 341 and on the exposed portions of the seed layer 340. The conductive material may be formed by plating, such as electroplating or electroless plating, or the like. The conductive material may comprise a metal, such as copper, titanium, platinum, silver, aluminum, gold, or the like. Then, the photoresist 341 and portions of the seed layer 340 on which the conductive material is not formed are removed. The photoresist 341 may be removed by an acceptable ashing or stripping process. After the photoresist 341 is removed, exposed portions of the seed layer 340 are removed, such as by using an acceptable etching process, such as by wet or dry etching. The remaining portions of the seed layer 340 and conductive material form conductive bridge 349 and conductive bridge 354.

FIGS. 29 through 32 illustrate top views of structures such as the structure of FIG. 28 or 28*a*, in accordance with some embodiments. One of skill will understand that the illustrated layouts of component devices are merely examples of many possible configurations and are not intended to be limiting. Any of the layouts of component devices and vias discussed herein or the like may be combined on the same substrate as needed.

Figure 29:
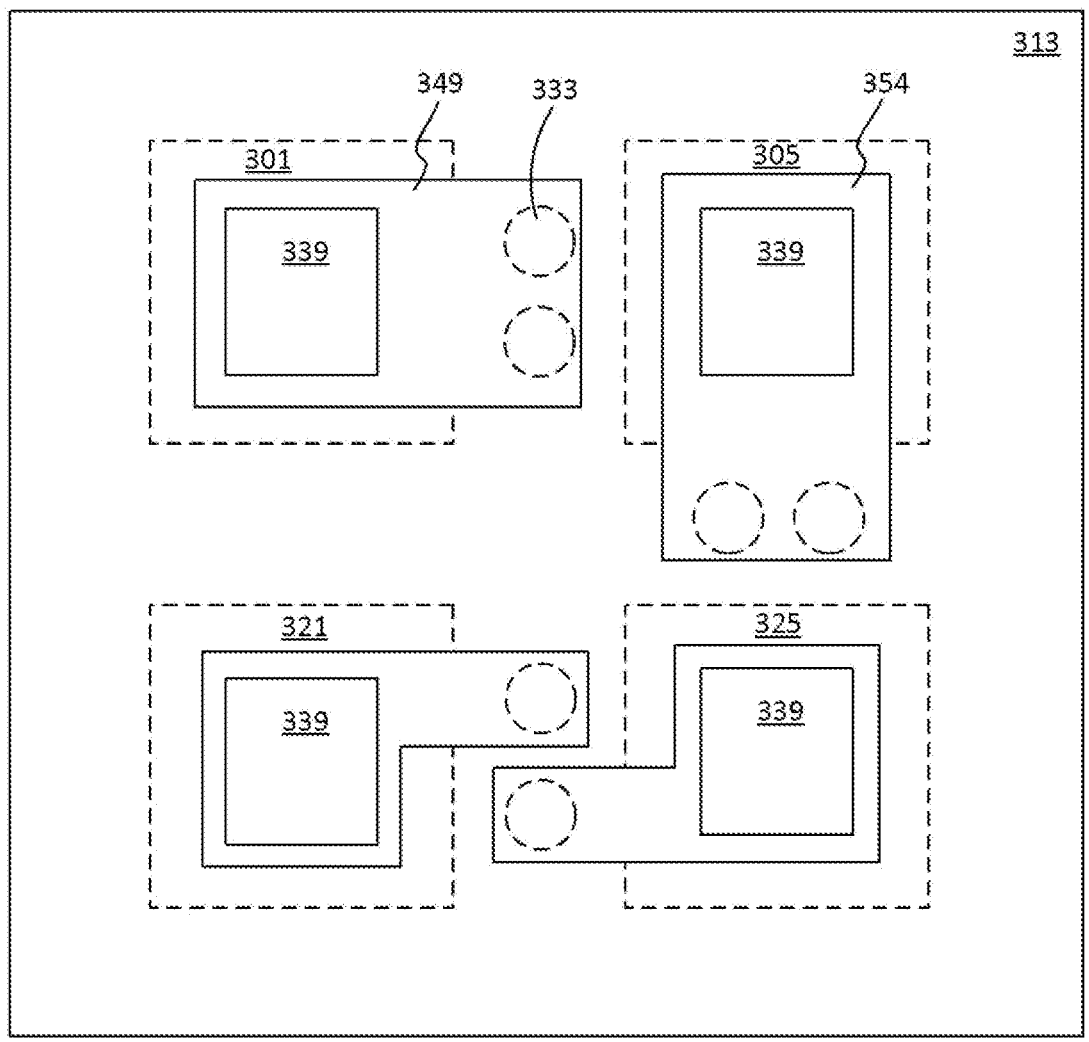

FIG. 29 illustrates a top view of the structure of FIG. 28 or 28*a*, in accordance with some embodiments. The upper electrode of component device 301 is illustrated as being coupled to two vias 333 by conductive bridge 349. The upper electrode of adjacent component device 305 is illustrated as being coupled to two vias 333 by conductive bridge 354. The two vias 333 coupled by conductive bridge 354 are disposed between component device 305 and another component device 325. Component device 321 is disposed adjacent to component device 325 with two vias 333 disposed between component device 321 and component device 325. One conductive bridge is illustrated as coupling an upper electrode of component device 321 to one of the vias 333, and another conductive bridge is illustrated as coupling an upper electrode of component device 325 to the other one of the vias 333. Other configurations are contemplated and additional examples are provided below.

Figure 30:
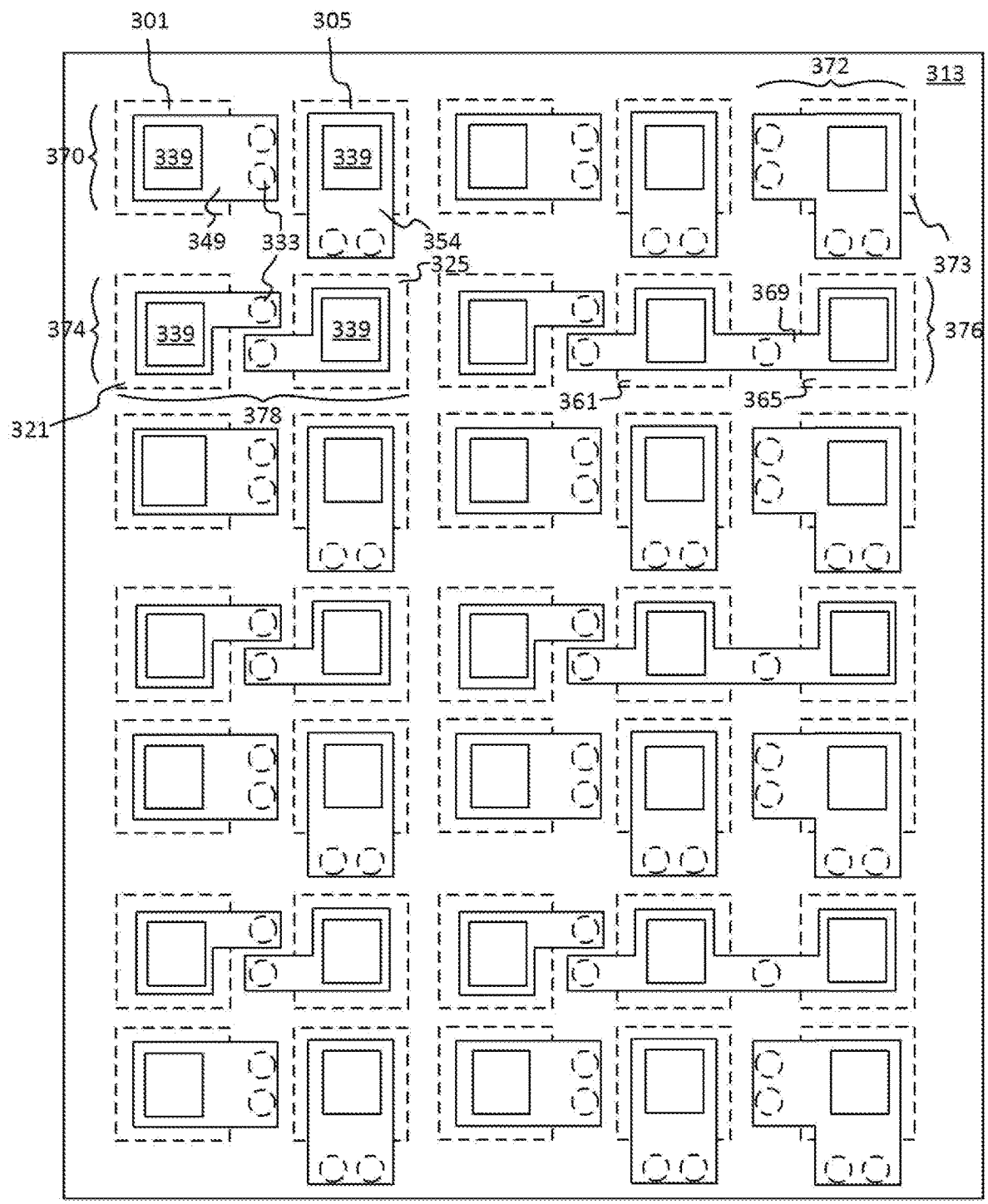

FIG. 30 illustrates a top view of the structure of FIG. 28 or 28*a*, in accordance with some embodiments. In FIG. 30, additional component devices are illustrated according to a particular device layout. FIG. 30 illustrates a configuration 370 of a component device 301 which is coupled to two vias 333. Another configuration 372 illustrates a component device 373 which is coupled to four vias 333, where two vias 333 are at one side of the component device 373 and the other two vias 333 are at another side of the component device 373. Any number of vias 333 may be coupled, depending on, for example, the amount of power supplied to the component device. Another configuration 374 illustrates a component device 321 which is bridged to a single via 333. Another configuration 376 illustrates at least two component devices 361 and 365 which have upper electrodes which are bridged by conductive bridge 369 to each other and at least one other via 333. Another configuration 378 illustrates a first component device 321 which is bridged to a first via 333 of two adjacent vias and a second component 325 device which is bridged to a second via 333 of the two adjacent vias. Configuration 378 is similar to the first component attachment area 10A and second component attachment area 10B, such as described with respect to FIG. 6.

Figure 31:
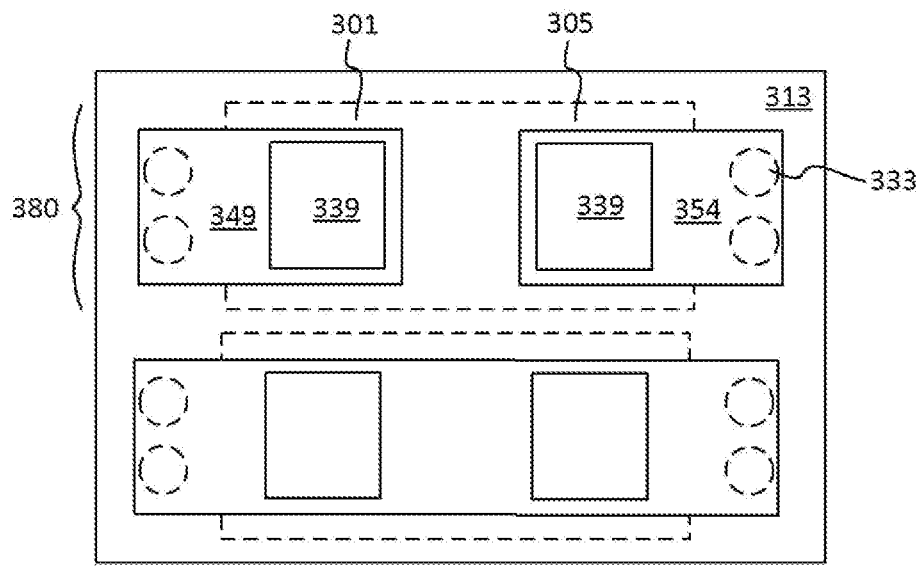

FIG. 31 illustrates a top view of the structure of FIG. 28 or 28*a*, in accordance with some embodiments. In some embodiments, multiple component devices, such as component device 301 and component device 305 may be left continuous, for example to achieve a higher power or more robust device.

Configuration 380 illustrates a component device which has two upper electrodes which are each coupled to one or more vias 333 by one or more conductive bridges, such as conductive bridge 349 and 354.

Figure 32:
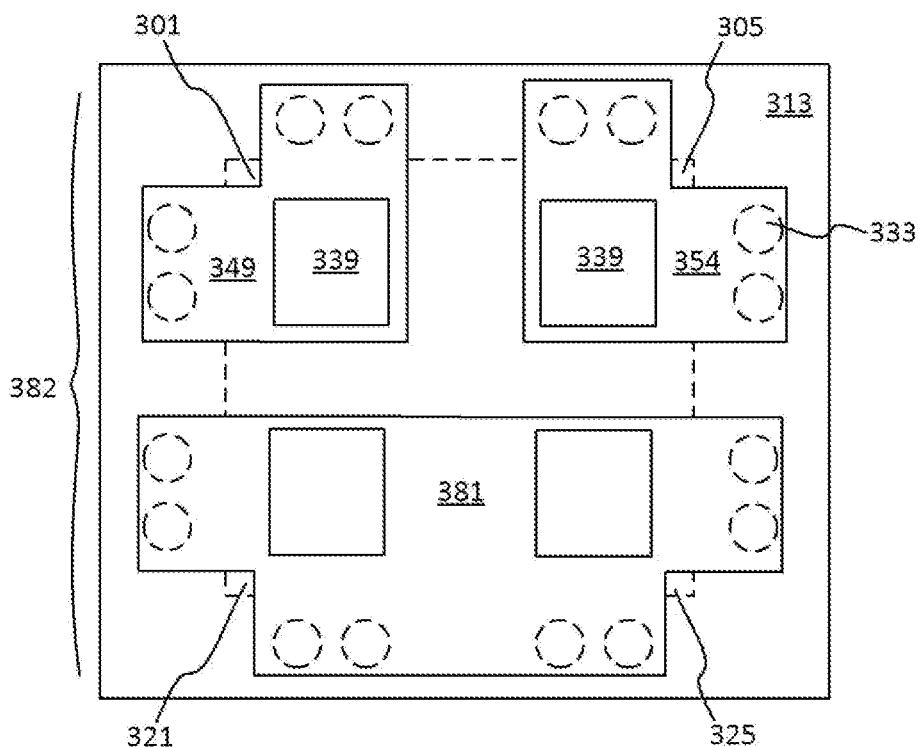

FIG. 32 illustrates a top view of the structure of FIG. 28 or 28*a*, in accordance with some embodiments. Similar to that discussed above with respect to FIG. 31, in some embodiments, multiple component devices, such as component device 301, component device 305, component device 321, and component device 325, may be left continuous, for example to achieve a higher power or more robust device. Configuration 382 illustrates a component device which has four upper electrodes 339 which are each coupled to one or more vias 333 by one or more conductive bridges, such as conductive bridge 349, 354, and 381.

Figure 33:
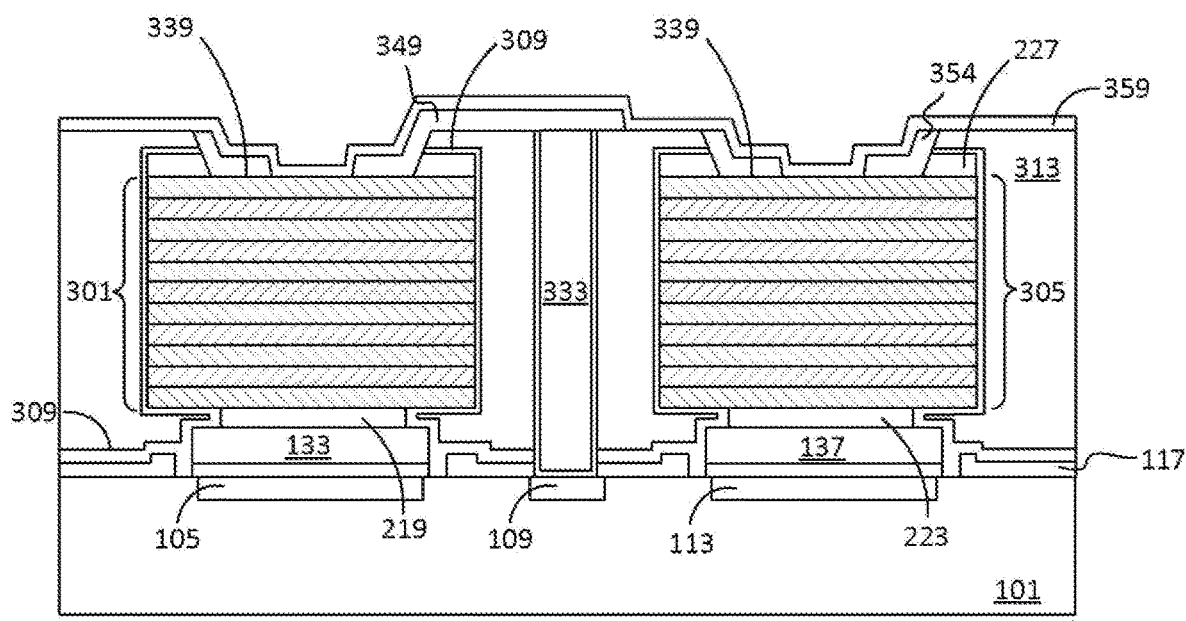

Referring to FIG. 33, a passivation layer 359 is formed over the component device 301 and component device 305 to provide physical and electrical protection of the gap fill material 313, conductive bridge 349, conductive bridge 354, and component devices 301 and 305. In some embodiments, passivation layer 359 may be formed of non-organic materials such as silicon oxide, un-doped silicate glass, silicon oxynitride, and the like, using suitable deposition processes. Other suitable passivation materials may also be used.

FIGS. 34 through 35 illustrate singulation of the substrate 101 into packages including one or more vertically aligned component devices. FIG. 34 illustrates dicing lines 410 positioned between package 402 and package 404 and between package 404 and package 406. Each of the packages includes multiple vertically aligned component devices, such as component devices 301 and 305, having upper electrodes 339 coupled to the underlying substrate 101 by one or more vias 333. FIG. 35 illustrates dicing lines 410 which are each similarly positioned between package 402 and package 404 and between package 404 and package 406. Each of the packages of FIG. 35 includes multiple vertically aligned component devices, such as component device 301 and 305, having upper electrodes 339 coupled to the underlying substrate by one or more vias 333. The packages illustrated in FIG. 35 also illustrate that a via 333 may be positioned between a component device and a sidewall of the package.

Singulation of substrate 101 may be performed by any suitable process. For example, singulation may occur by a mechanical saw/blade, a laser, etching, combinations thereof, or the like. The singulation of substrate 101 into multiple packages may be performed in multiple passes.

FIGS. 36 through 46 illustrate views of intermediate processes of forming a high aspect ratio via in accordance with some embodiments. The processes depicted in FIGS. 36 through 46 are similar to the processes described above with respect to FIGS. 1 through 35, except that the component devices (see FIG. 13) are pre-formed. In FIGS. 36 through 46, individual components are bonded to a substrate and a package is formed which uses a high-aspect ratio via to electrically couple a top electrode of vertically aligned components to the underlying substrate wafer.

Figure 36:
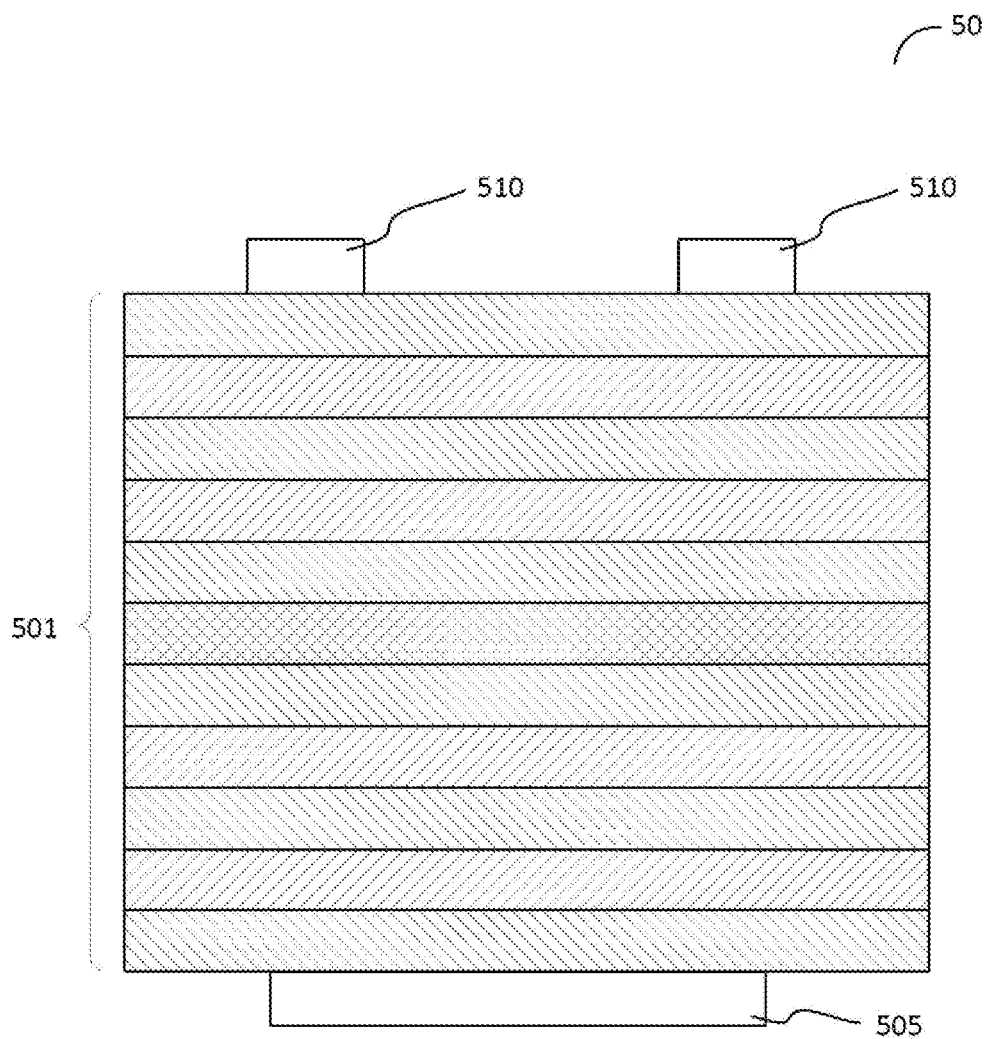
FIG. 36 illustrates a component, in accordance with some embodiments.

Referring to FIG. 36, a pre-formed component device 50 is illustrated. Component device 50 may be similar to the component devices which are formed as part of bonding a component substrate 201 to substrate 101 and singulating the component substrate into component devices, such as component device 301 and component device 305 (see FIGS. 7 through 13). Component device 50 may have a bottom electrode 505 and upper electrode 510. The bottom electrode 505 may have a width between about 3 µm and 45 µm, such as about 8 µm. The upper electrode 510 may have a single electrode or dual electrode configuration. The upper electrode 510 may be oriented at the periphery of the upper surface of component device 50, such as in the case where the upper electrode 510 is desired to be kept out of a line of sight for an upper surface of the component device 50. In some embodiments, the bottom electrode 505 and/or upper electrode 510 may include gold, copper, or other conductive pad. In some embodiments, the bottom electrode 505 and/or upper electrode 510 may include a solder bump.

Component device 50 may also have a substrate 501 including a series of any number of layers which together provide the operating characteristics of component device 50. Each layer of substrate 501 may be between about 30 nm and about 300 nm, such as about 70 nm. Substrate 501 may any number of suitable layers, such as between 2 and 100 layers, such as 60 layers. An overall thickness of substrate 501 may be between about 2 µm and 30 µm, such as about 10 µm. Other dimensions for layers of substrate 501 are contemplated and may be used. An overall width of substrate 501 may be between about 6 µm and 90 µm, such as about 20 µm. Other dimensions for the size of substrate 501 are contemplated and may be used. Component device 50 may be a device such as a diode, laser diode, LED, metal-insulator-metal diode, power amplifier, or other semiconductor device. Candidate components for may include any combination of the above.

An example device which may correspond to substrate 501 of component device 50 may be the same as or similar to substrate 201 described above with respect to FIG. 7a.

Figure 37:
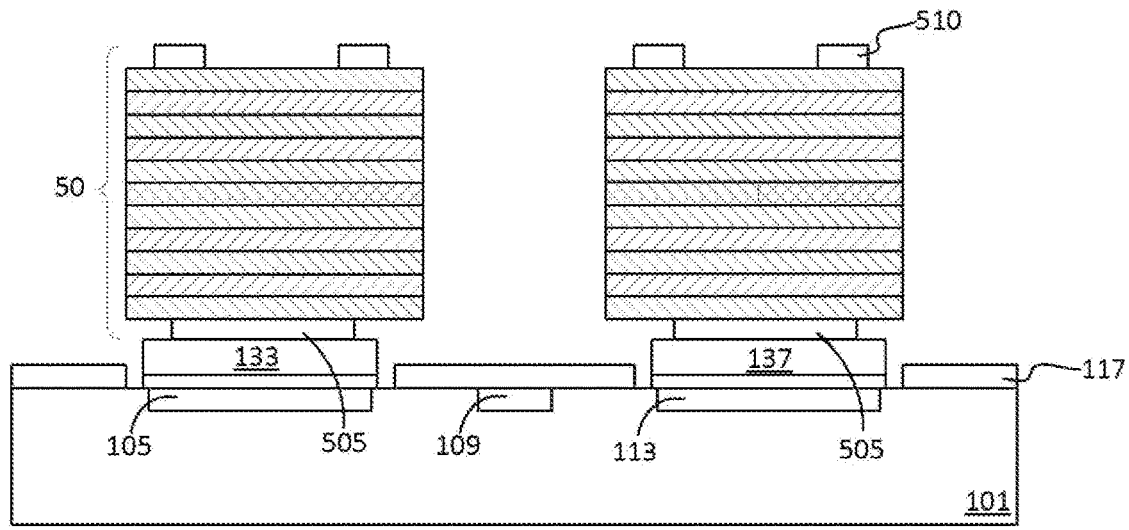
FIGS. 37 through 46 illustrate various views of intermediate processes of forming a high aspect ratio via, in accordance with some embodiments.

Referring to FIG. 37, substrate 101 is provided with metal pad 105, metal pad 109, and metal pad 113 formed therein, at the point of processing following FIG. 5, described above. Component devices 50 are bonded to substrate 101 using a pick and place process or other suitable component transfer process. A pick and place process may select individual component devices 50 and bond each component device 50 to a corresponding contact pad of substrate 101, such as metal pad 133 or metal pad 137. In some embodiments, each component device 50 may be attached to carrier, tape, or transport arm of a pick and place apparatus, positioned over a contact pad of substrate 101 and bonded thereto. In some embodiments, a mass transfer technology (similar to that used in fabrication of micro LED devices) may be used to transfer component devices 50 to corresponding contact pads of substrate 101. In some embodiments, the bonding may be performed by a direct metal-to-metal bonding, such as a copper-to-copper or gold-to-gold bonding. In other embodiments, the bonding may be performed by a solder joint.

Figure 38:
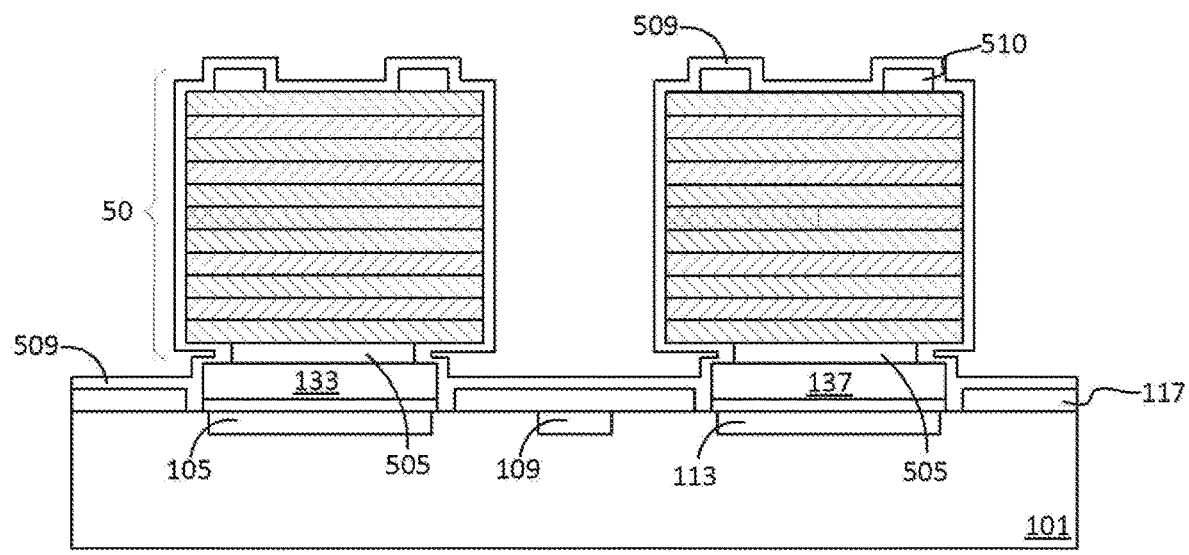

Referring to FIG. 38, a protective dielectric film 509 is formed surrounding component devices 50. The protective dielectric film 509 may be formed using materials and processes similar to those discussed above with respect to protective dielectric film 309 (FIG. 15), which are not repeated.

Figure 39:
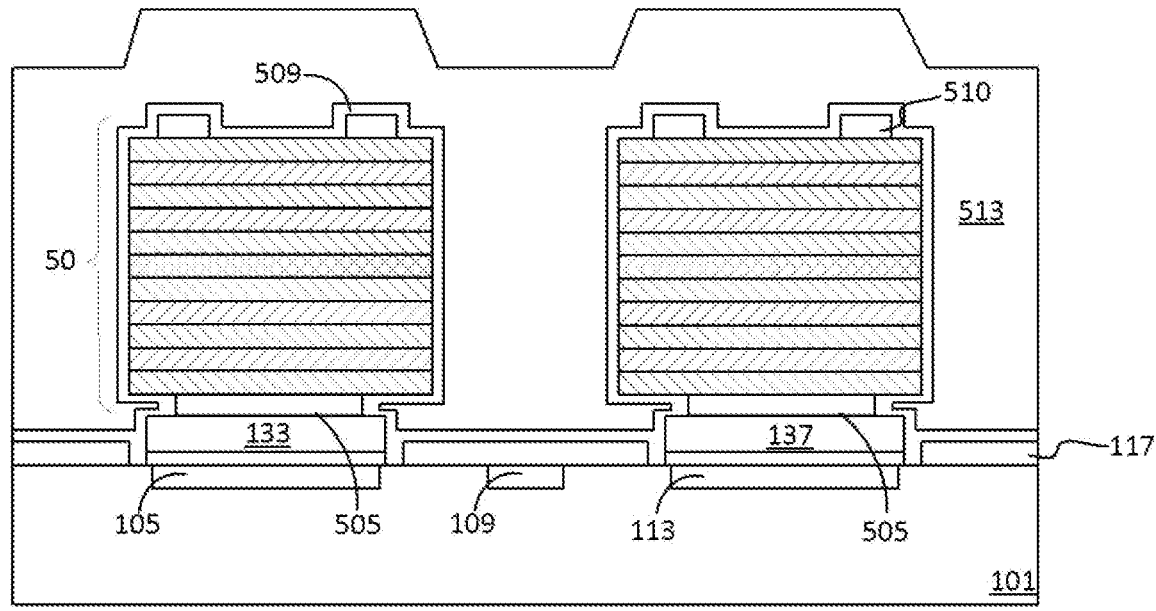

Referring to FIG. 39, a gap fill material 513 may be deposited over the whole structure. The gap fill material 513 may be formed using materials and processes similar to those discussed above with respect to gap fill material 313 (FIG. 16), which are not repeated.

Figure 40:
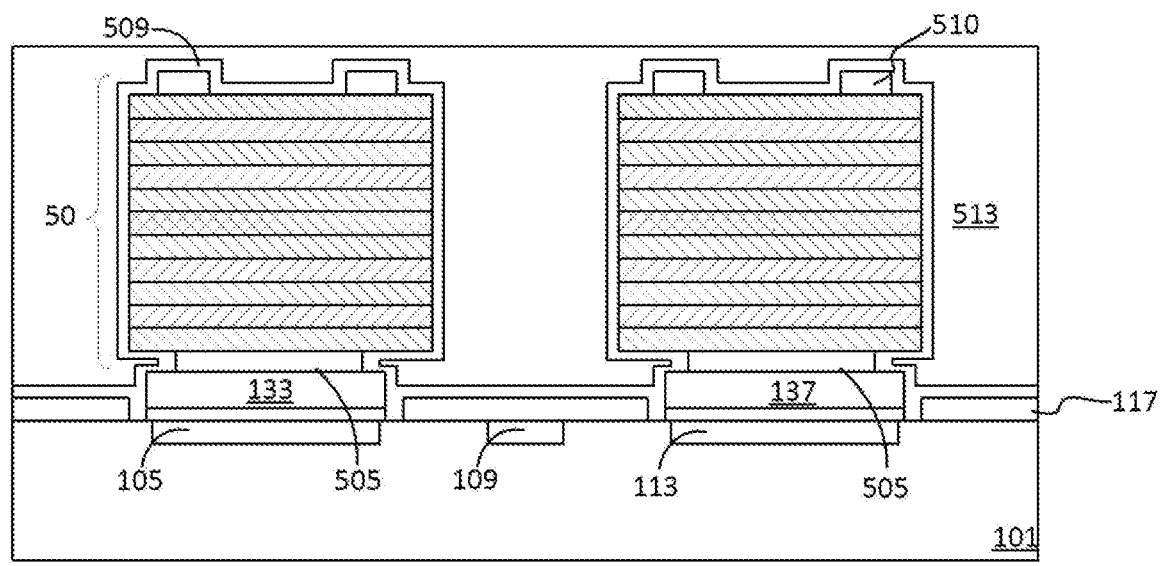

Referring to FIG. 40, the structure of FIG. 39 is planarized to level the top of the gap fill material 513. In some embodiments, the planarization may be performed to expose the upper electrode 510 of component device 50, while in other embodiments, the planarization may leave a portion of the gap fill material 513 over the upper electrode 510. Planarization may be performed by any suitable means, such as by CMP, or the like.

Figure 41:
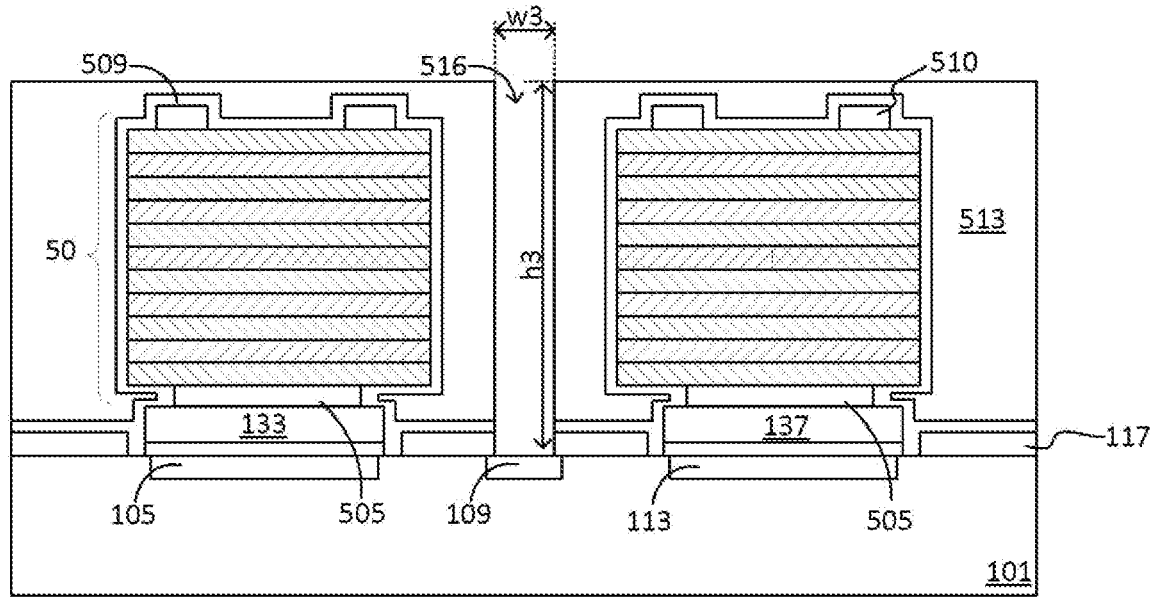

Referring to FIG. 41, a via opening 516 is formed adjacent to one of the component devices 50. In some embodiments, via opening 516 is formed between two adjacent component devices 50. Via opening 516 exposes metal pad 109 of the substrate 101. Additional via openings may be formed as appropriate for the layout and design. Via opening 516 may be formed using processes and materials similar to those discussed above with respect to via opening 316 (FIG. 18), which are not repeated. Via opening 516 may have a width w3 or critical dimension of about 0.5 µm to about 10 µm, such as about 1 µm and a height h3 of about 1 µm to about 100 µm, such as about 10 µm, although other dimensions are contemplated. Via opening 516 may have high aspect ratio of height to width between about 2 and 10, such as about 5.

Figure 42:
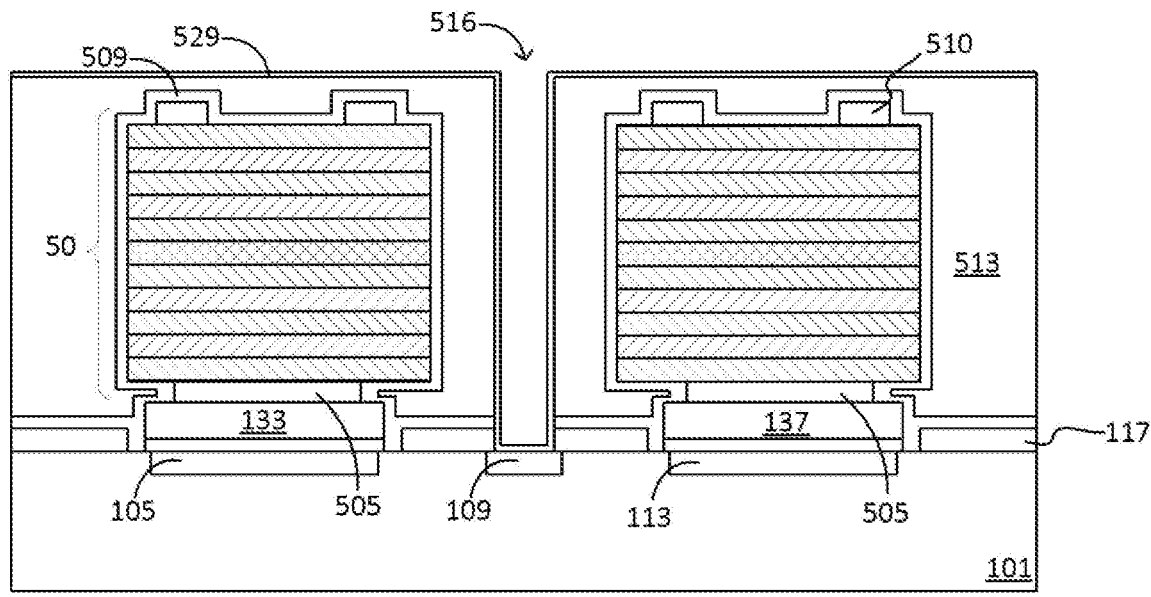

Referring to FIG. 42, a diffusion barrier 529 is formed over the structure and into the via opening 516. The diffusion barrier 529 prevents the material of the subsequently formed via from leeching or diffusing into the surrounding gap fill material. The diffusion barrier 529 may be formed using processes and materials similar to those discussed above with respect to diffusion barrier 329 (FIG. 21), which are not repeated.

Figure 43:
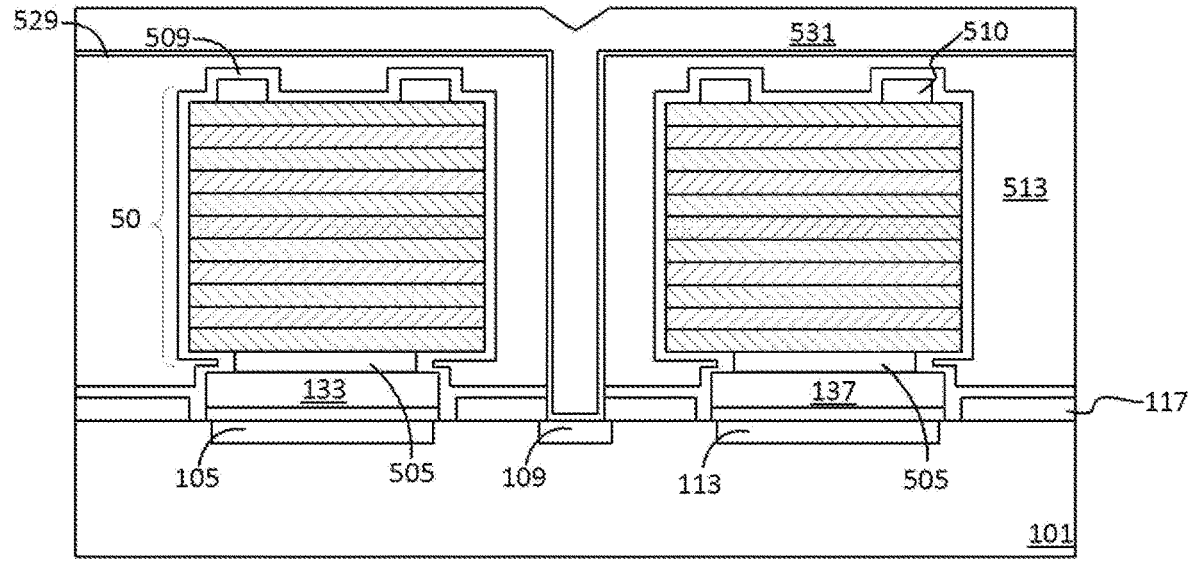

Referring to FIG. 43, following the formation of the diffusion barrier 529, the via opening 516 (see FIG. 42) is filled by a conductive material through a plating process, thereby forming conductive fill 531 in the via opening 516 and over the gap fill material 513 and component devices 50, in accordance with some embodiments. The material of conductive fill 531 may include copper or other suitable metallic materials such as W or Al. Other suitable deposition techniques may be used.

Figure 44:
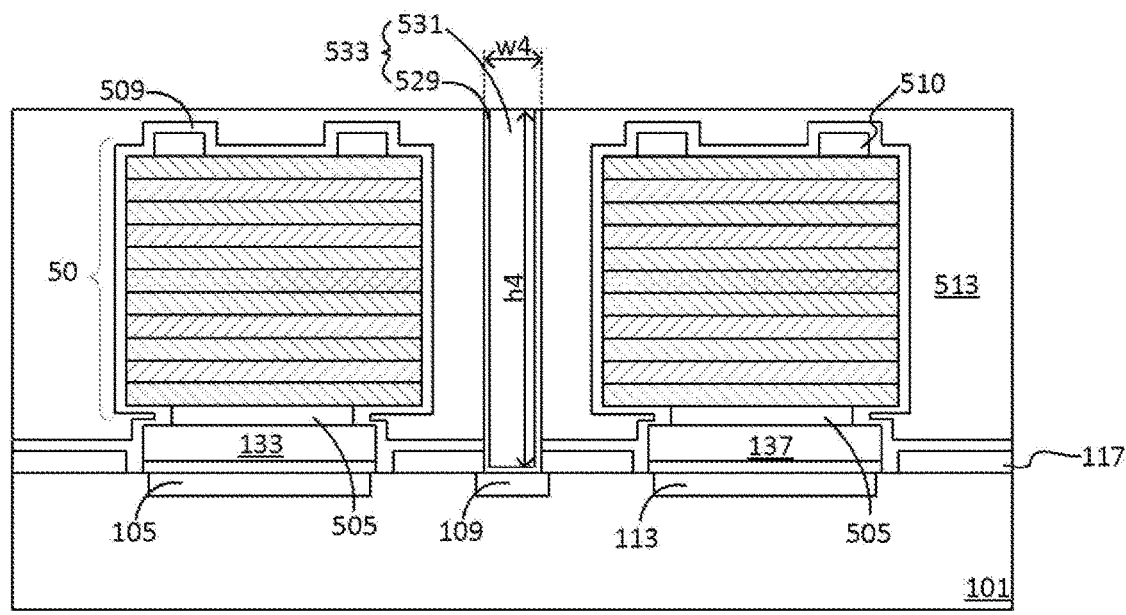

Referring to FIG. 44, a planarization process may be used to level the top surface of material of conductive fill 531 and remove portions of the conductive fill 531 and portions of the diffusion barrier 529 which extend beyond the via opening 516 (see FIG. 42). The diffusion barrier 529 and conductive fill 531 together form a conducive via 533. Conductive via 533 may have a width w4 or critical dimension be between about 0.5 µm and about 10 µm, such as about 1 µm, and a height h4 between about 1 µm and about 100 µm, such as about 10 µm, although other dimensions are contemplated. Conductive via 533 may have high aspect ratio of height to width between about 2 and 10, such as about 5. Any suitable planarization process may be used, including a CMP or etching process, or combinations thereof, depending on the conductive material of via 533. In some embodiments, the planarization process may level the top surface of the conductive fill 531 and diffusion barrier 529 to the top surface of the protective dielectric film 509. Following formation of via 533, the top of the component devices 50 may be closer to the substrate 101 than the top of the via 533. In other words, the top of via 533 may protrude further from the substrate 101 than the component devices 50.

Figure 45:
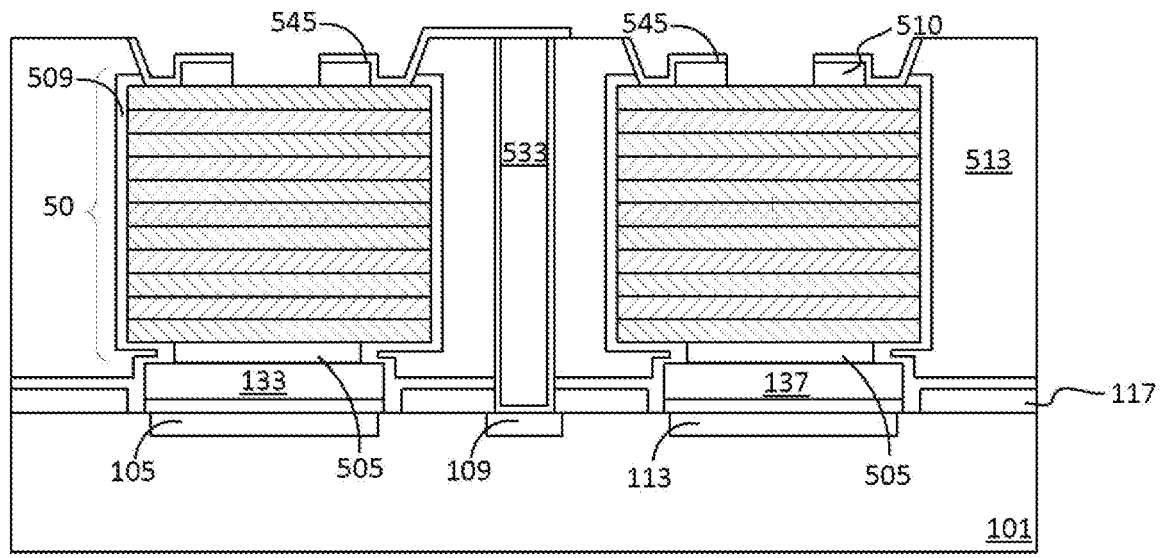

Referring to FIG. 45, the tops of component devices 50 and upper electrodes 510 of component devices 50 are exposed by a photo-patterning and etching process, similar to that described above with respect to FIGS. 24 and 25, which are not repeated. Conductive bridges 545 are formed over the structure to bridge the upper electrodes 510 of component devices 50 to the uppermost surfaces of the vias 533. The conductive bridges 545 may be formed using processes and materials similar to those discussed above with respect to conductive bridge 349 and conductive bridge 354 of FIGS. 27 and 28 or with respect to conductive bridge 349 and conductive bridge 354 of FIGS. 27a and 28a, which are not repeated.

In some embodiments, conductive bridges 545 may be formed to partially cover the top surfaces of component devices 50. For example, in embodiments where component device 50 is an LED, a light emitting part of component device 50 may remain exposed from the conductive bridges 545. In some embodiments, conductive bridges 545 may span multiple component devices 50. The top views of FIGS. 29 through 32, discussed above, may be similar to top views of these embodiments.

Figure 46:
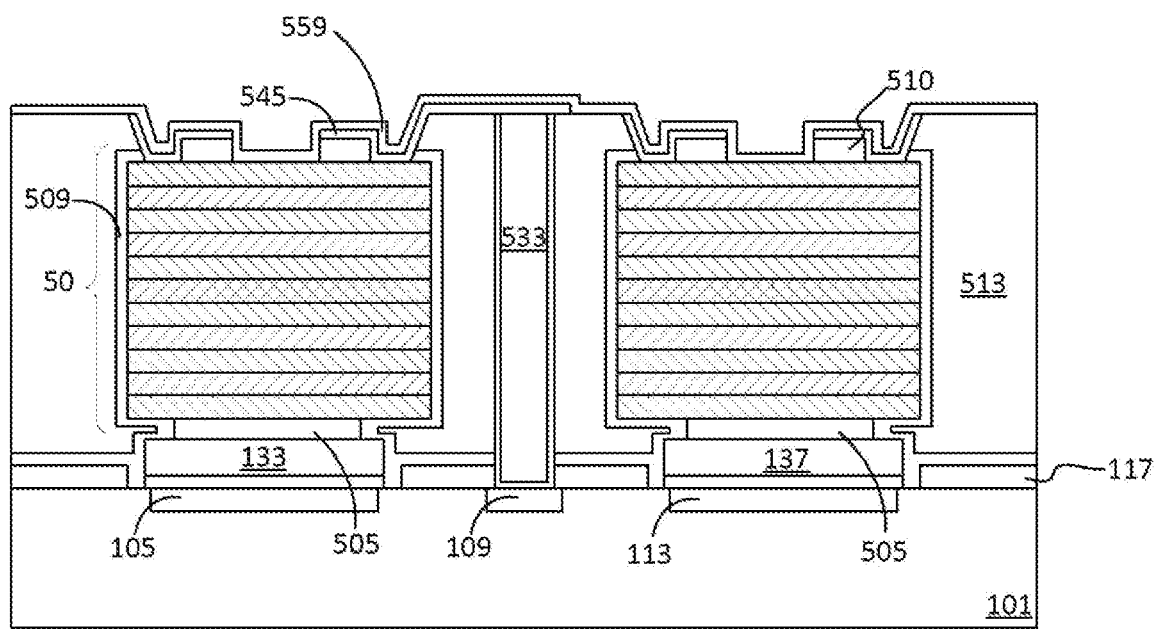

Referring to FIG. 46, a passivation layer 559 is formed over the component devices 50 to provide physical and electrical protection of the conductive bridges 545 and component devices 50. In some embodiments, passivation layer 559 may be formed of non-organic materials such as silicon oxide, un-doped silicate glass, silicon oxynitride, and the like, using suitable deposition processes. Other suitable passivation materials may also be used.

Substrate 101 may be singulated into packages of one or more vertically aligned component devices. Singulation may be performed using processes and materials similar to those described with respect to FIGS. 34 and 35, which are not repeated. Each of the resulting packages may include multiple vertically aligned component devices 50 having upper electrodes coupled to the underlying substrate by one or more vias 533.

Figure 47:
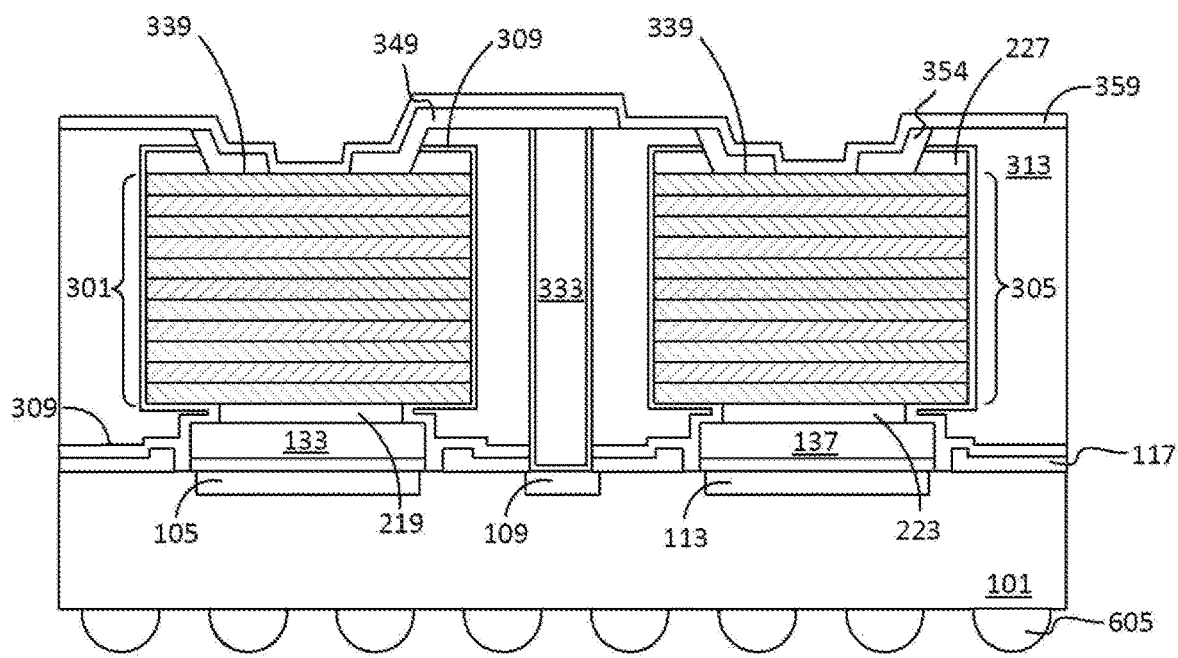
FIGS. 47-50 illustrate various packages having a high aspect ratio via, in accordance with some embodiments.
Figure 48:
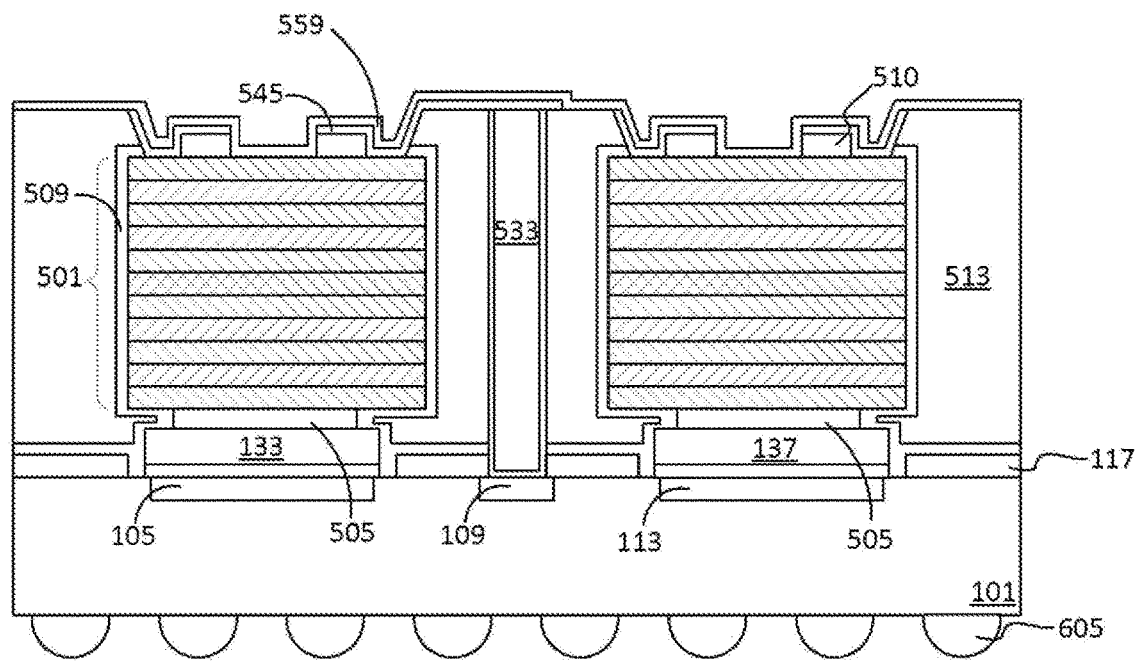

Referring to FIGS. 47 and 48, in some embodiments, prior to singulation or after singulation, the package of FIG. 33 (for FIG. 47) or the package of FIG. 46 (for FIG. 48) may have connectors 605 formed at a backside surface of the substrate 101 for mounting on another package or device. The backside surface of the substrate 101 may be processed to expose conductive features, such as by thinning, laser drilling, patterning, or combinations thereof. Connectors 605 may be solder balls, such as microbumps, controlled collapse chip connection (C4) bumps, ball grid array (BGA) balls, and the like. Connectors 605 may be formed, for example, using a ball mounting technique. In other embodiments, connectors 605 may be formed prior to removing a photoresist which is used to define a pattern of under bump metallurgy (UBM) layers (not shown) formed on the exposed conductive features. UBMs may be formed using a seed layer, patterned photoresist, and plating process similar to that described above with respect to metal pad 133 (FIGS. 4 through 5), for example. After UBMs are formed, an additional tin plating may be performed to form a solder layer on the UBMs. The photoresist and portions of the seed layer on which the conductive material is not formed is then removed as described above. After the photoresist and seed layer are removed, a reflow process may be performed to form solder balls (e.g., connectors 605).

Figure 49:
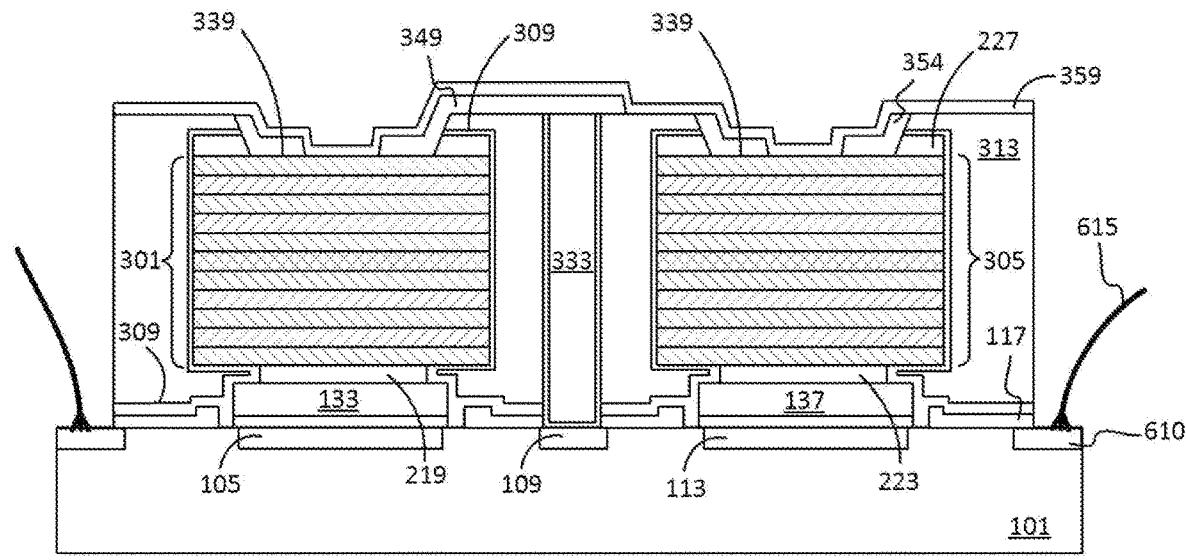
Figure 50:
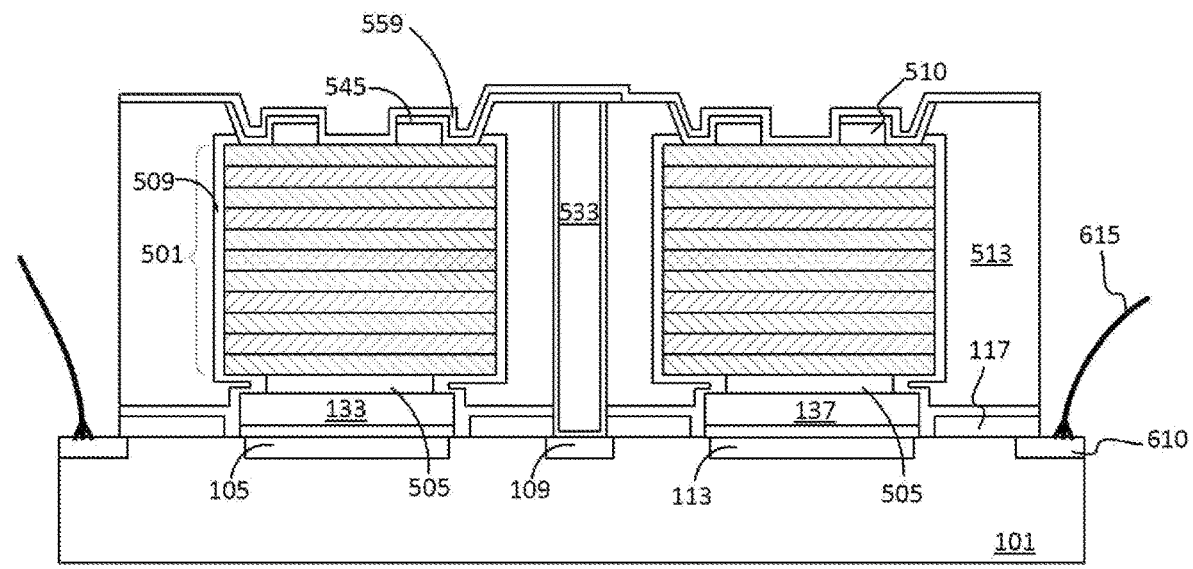

Referring to FIGS. 49 and 50, in some embodiments, prior to singulation or after singulation, the package of FIG. 33 (for FIG. 49) or the package of FIG. 46 (for FIG. 50) may have wire bond pads formed at peripheral portions at a top surface of the substrate 101 for coupling to another package or board. Contacts 610 may be previously formed in the substrate 101. The singulation process or an etching process may trim the sidewalls of the gap fill material 313 or gap fill material 513 to expose the peripheral portion of the substrate 101. Etching may be used to expose the previously formed contacts 610. After mounting the package to another package or device, a wire bonding process may attach wire bonds 615 to corresponding conductors of the other package or device.

One embodiment is a method, including bonding a bottom electrode of a component substrate to a first metal pad of a semiconductor substrate. The component substrate is patterned to form a component device. A gap fill material is formed over the semiconductor substrate to encapsulate the component device. A first via opening is formed adjacent the component, the first via opening extending through the gap fill material and exposing a second metal pad of the semiconductor substrate. A first via is formed in the first via opening. A top electrode of the component device is coupled to a top of the first via, the coupling providing an electrical connection between the upper electrode and the second metal pad.

Some embodiments may include one or more of the following additional features or aspects of the method. The method may further include, after patterning the component substrate to form the component device, forming a protective layer over the component device. The method may further include exposing a top surface of the component to expose the top electrode from the gap fill material. The coupling may include forming a conductive bridge between the top of the first via and the upper electrode. Forming the conductive bridge may include patterning a photoresist to cover portions of the top electrode and the gap fill material, depositing a first conductive material over the patterned photoresist and over the top electrode and the top of the first via, and stripping the photoresist, the stripping causing portions of the first conductive material on the photoresist to be removed. The separating the component from the component wafer may include etching through one or more layers of the component wafer. Bonding the bottom electrode of the component substrate to the first metal pad of the semiconductor substrate may include a direct metal-to metal bond between the first metal pad of the semiconductor substrate and the bottom electrode of the component substrate. Bonding the bottom electrode of the component substrate to the first metal pad of the semiconductor substrate may include forming a solder joint between the first metal pad of the semiconductor substrate and the bottom electrode of the component substrate. Forming the first via may include depositing a barrier layer in the first via opening and over the gap fill material, filling the first via opening with a first conductive material, the first conductive material extending laterally beyond sidewalls of the first via opening, and planarizing the first conductive material and the barrier layer to level the top of the first via with an uppermost surface of the gap fill material. The method may further include forming a second via adjacent the first via. A top of the second via may be coupled to the upper electrode of the component device. These additional features or aspects may be combined into the other embodiments described above.

Another embodiment is a method including bonding a first component device and a second component device to a respective first metal pad and second metal pad of a semiconductor substrate, the first component device being adjacent to the second component device. A gap fill material is disposed laterally surrounding the first component device and the second component device. A via opening is etched between the first component device and the second component device to expose a third metal pad of the semiconductor substrate. A via is formed in the via opening. A top electrode of the first component device is coupled to the third metal pad by the via.

Some embodiments may include one or more of the following additional features or aspects of the method. The method may further include depositing a protective layer over the first component device and the second component device. Bonding the first component device to the first metal pad of the semiconductor substrate may include a direct metal-to metal bond between the first metal pad of the semiconductor substrate and a bottom electrode of the first component device, where an interface of the first metal pad and the bottom electrode is free of solder material. Forming the via may include depositing a barrier layer in the via opening and over the gap fill material, filling the via opening with a first conductive material, the first conductive material extending over the gap fill material, and planarizing the first conductive material and the barrier layer to level a top of the via with an uppermost surface of the gap fill material. The via may be a first via, and the method may further include forming a second via adjacent the first via, and coupling a top electrode of the second component device to a top of the second via. These additional features or aspects may be combined into the other embodiments described above.

Another embodiment is a structure, including a semiconductor substrate, having a first metal pad and second metal pad disposed at a top surface of the semiconductor substrate. The structure also includes a first component having a bottom electrode and a top electrode opposite the bottom electrode, the top electrode coupled to the first metal pad. A gap fill material is on the semiconductor substrate and laterally encapsulates the first component. A first metal via is disposed within the gap fill material adjacent the first component, the first metal via disposed directly over and electrically coupled to the second metal pad. A conductive bridge couples the top electrode of the first component to a top portion of the first metal via.

Some embodiments may include one or more of the following additional features or aspects. The structure may have the top electrode of the first component closer to the semiconductor substrate than the top portion of the first metal via. The structure may have a first portion of a top surface of the component which is surrounded by the conductive bridge, the first portion being uncovered by the conductive bridge. The structure may further include a second metal via disposed within the gap fill material adjacent the first component and the first metal via, where the conductive bridge further couples the top electrode of the first component to a top portion of the second metal via. These additional features or aspects may be combined into the other embodiments described above.

Another embodiment is a structure including a first metal pad and a second metal pad disposed at an upper surface of a substrate. The structure also includes a first component attached to the first metal pad, the first component including a bottom electrode and a top electrode, the bottom electrode attached to the first metal pad, the top electrode electrically coupled to the second metal pad. The structure also includes an encapsulant over the substrate and laterally encapsulating the first component. The structure also includes a first metal via disposed within the encapsulant adjacent the first component, the first metal via disposed directly over and electrically coupled to the first metal pad, the first metal via extending vertically from an upper surface of the encapsulant to a lower surface of the encapsulant, the first metal via (333) having a homogeneous structure. The structure also includes a conductive bridge coupling the top electrode of the first component to a top portion of the first metal via.

Another embodiment is a structure including a first component attached to a device substrate. The structure also includes a second component attached to the device substrate. The structure also includes an encapsulant laterally surrounding the first component and the second component, a portion of the encapsulant vertically overlapping an upper surface of the first component. The structure also includes a metal via extending through the encapsulant from a height greater than a top of the first component to the device substrate, the metal via disposed between the first component and the second component.

Another embodiment is a device including a first light emitting diode (LED) attached to a device substrate. The device also includes a second LED attached to the device substrate. The device also includes an encapsulant surrounding the first LED and the second LED. The device also includes a metal via disposed adjacent to the first LED, the metal via extending through the encapsulant, the metal via having an upper surface level with an upper surface of the encapsulant and a lower surface contacting a first contact pad of the device substrate. The device also includes and a bridge metal coupling an upper electrode of the first LED to the metal via, where an exposed portion of an upper surface of the first LED is exposed from the bridge metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a first metal pad and a second metal pad disposed at an upper surface of a substrate;
    a first component attached to the first metal pad, the first component comprising a bottom electrode and a top electrode, the bottom electrode attached to the first metal pad, the top electrode electrically coupled to the second metal pad;
    an encapsulant over the substrate and laterally encapsulating the first component, the encapsulant having an upper surface further from the substrate than an upper surface of the first component;
    a first metal via disposed within the encapsulant adjacent the first component, the first metal via disposed directly over and electrically coupled to the second metal pad, the first metal via having a vertical sidewall that extends continuously vertically from an uppermost surface of the encapsulant to a lower than a bottommost surface of the encapsulant in a cross-sectional view; and
    a conductive bridge coupling the top electrode of the first component to a top portion of the first metal via.

2. The structure of claim 1, wherein the top electrode of the first component is closer to the substrate than the top portion of the first metal via.

3. The structure of claim 1, wherein a first portion of a top surface of the first component is circumscribed by the conductive bridge, the first portion being uncovered by the conductive bridge.

4. The structure of claim 1, further comprising a second metal via disposed within the encapsulant adjacent the first component and the first metal via, wherein the conductive bridge electrically couples the top electrode of the first component to a top portion of the second metal via.

5. The structure of claim 1, wherein a height of the first metal via is greater than a height of the first component.

6. The structure of claim 1, wherein the first metal via extends above an upper surface of the first component.

7. The structure of claim 6, wherein the first metal via extends below a lower surface of the first component.

8. The structure of claim 1, further comprising a liner layer disposed over the first metal pad, the first metal via extending through the liner layer.

9. The structure of claim 8, wherein the liner layer surrounds the first component.

10. A structure comprising:
a first component attached to a device substrate;
a second component attached to the device substrate;
an encapsulant laterally surrounding the first component and the second component, an upper surface of the encapsulant extending continuously from the first component to the second component, a portion of the encapsulant vertically overlapping an upper surface of the first component; and
a metal via extending through the encapsulant from a height greater than a top of the first component to the device substrate, where a vertical sidewall of the metal via extends continuously vertically from the height greater than the top of the first component to lower than a bottom surface of the encapsulant in a cross-sectional view, the metal via disposed between the first component and the second component.

11. The structure of claim 10, wherein the metal via has an elongated shape in top down view.

12. The structure of claim 10, wherein the metal via comprises a metal fill surrounded by a barrier.

13. The structure of claim 10, wherein the metal via is physically coupled to a conductive bridge, the conductive bridge extending from the metal via to an upper electrode of the first component.

14. The structure of claim 13, wherein the upper electrode of the first component is in a depression in an upper surface of the first component.

15. The structure of claim 10, further comprising a protective layer disposed over a contact pad of the device substrate, the metal via extending through the protective layer to contact the contact pad.

16. A device comprising:
a first light emitting diode (LED) attached to a device substrate;
a second LED attached to the device substrate;
an encapsulant surrounding the first LED and the second LED, a thickness of the encapsulant being greater than a thickness of the first LED;
a metal via disposed adjacent to the first LED, the metal via extending through the encapsulant, the metal via having an upper surface level with an upper surface of the encapsulant and a lower surface contacting a first contact pad of the device substrate, wherein the metal via has a constant thickness from a first sidewall of the metal via to a second sidewall of the metal via opposite the first sidewall, wherein the first sidewall and the second sidewall span from the upper surface of the encapsulant to the lower surface of the metal via contacting the first contact pad, the metal via extending lower than a bottom surface of the encapsulant; and
a bridge metal coupling an upper electrode of the first LED to the metal via, wherein an exposed portion of an upper surface of the first LED is exposed from the bridge metal.

17. The device of claim 16, wherein the exposed portion of the upper surface of the first LED is encircled by the bridge metal.

18. The device of claim 16, wherein the metal via comprises a metal fill surrounded by a barrier, the metal fill extending from the upper surface of the metal via to a lower surface of the barrier.

19. The device of claim 16, wherein the upper surface of the metal via is further from the device substrate than an upper surface of the first LED.

20. The device of claim 16, wherein the first LED is attached to the device substrate by a first metal pad disposed between a second contact pad of the device substrate and a bottom electrode of the first LED.

* * * * *